US012598367B2

(12) United States Patent
Kumon et al.

(10) Patent No.: US 12,598,367 B2
(45) Date of Patent: Apr. 7, 2026

(54) ELECTRONIC APPARATUS CAPABLE OF SETTING AN OPERATION MODE OF A COOLING UNIT AND CONTROL METHOD

(71) Applicant: CANON KABUSHIKI KAISHA, Tokyo (JP)

(72) Inventors: Sayaka Kumon, Kanagawa (JP); Ryuki Hashida, Tokyo (JP); Yuma Naito, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 62 days.

(21) Appl. No.: 18/680,490

(22) Filed: May 31, 2024

(65) Prior Publication Data

US 2024/0422412 A1    Dec. 19, 2024

(30) Foreign Application Priority Data

Jun. 16, 2023    (JP) ................................. 2023-099545
Mar. 21, 2024    (JP) ................................. 2024-045344

(51) Int. Cl.
| | |
|---|---|
| *H04N 23/52* | (2023.01) |
| *G03B 17/55* | (2021.01) |
| *G06F 1/20* | (2006.01) |
| *H04N 23/57* | (2023.01) |
| *H04N 23/60* | (2023.01) |

(Continued)

(52) U.S. Cl.
CPC ............. *H04N 23/52* (2023.01); *H04N 23/57* (2023.01); *H04N 23/60* (2023.01); *H05K 7/20136* (2013.01); *H05K 7/20209* (2013.01); *G03B 17/55* (2013.01); *G06F 1/20* (2013.01);

(Continued)

(58) Field of Classification Search
CPC ........ H04N 23/52; H04N 23/57; H04N 23/60; H04N 23/62; H04N 23/631; H04N 23/65; H04N 23/651; G03B 17/55; G03B 30/00; H05K 7/20; H05K 7/20136; H05K 7/20209; G06F 1/20; G06F 1/203; G06F 1/206; G06F 1/1605; G06F 1/1686; H04M 1/0264; H04R 1/00; H04R 2499/11

See application file for complete search history.

(56) References Cited

U.S. PATENT DOCUMENTS

| | | |
|---|---|---|
| 5,848,282 A | 12/1998 | Kang |
| 2009/0168333 A1 | 7/2009 | Saito |

(Continued)

FOREIGN PATENT DOCUMENTS

| | | | | |
|---|---|---|---|---|
| JP | 2010062892 A | * | 3/2010 | ............. G11B 19/04 |
| JP | 2018094802 A | | 6/2018 | |
| JP | 2021117924 A | | 8/2021 | |

*Primary Examiner* — Twyler L Haskins
*Assistant Examiner* — Akshay Trehan
(74) *Attorney, Agent, or Firm* — Cowan, Liebowitz & Latman, P.C.

(57) ABSTRACT

An electronic apparatus can record a moving image and sound, and includes a cooling unit that cools the apparatus, a setting unit that sets an operation mode of the cooling unit, and a control unit that controls the cooling unit based on the operation mode of the cooling unit. The control unit sets the operation mode of the cooling unit set by the setting unit, when sound recording is in progress, and sets the operation mode of the cooling unit to a driving state in which a cooling capability of the cooling unit is maximum, when sound recording is not in progress.

18 Claims, 15 Drawing Sheets

(51) Int. Cl.
  *H04N 23/62*          (2023.01)
  *H04N 23/65*          (2023.01)
  *H05K 7/20*           (2006.01)
(52) U.S. Cl.
  CPC .............. *H04N 23/62* (2023.01); *H04N 23/65*
          (2023.01); *H04R 2499/11* (2013.01)

(56)                References Cited

U.S. PATENT DOCUMENTS

| | | | | |
|---|---|---|---|---|
| 2010/0079094 A1* | 4/2010 | Beltman | ................. | G06F 1/206 |
| | | | | 361/679.48 |
| 2010/0302467 A1* | 12/2010 | Nagaharu | .............. | G03B 21/22 |
| | | | | 348/759 |
| 2021/0141428 A1* | 5/2021 | Lin | ........................ | G05B 15/02 |
| 2021/0233209 A1* | 7/2021 | Yoshida | .................... | G06T 5/50 |
| 2022/0311949 A1* | 9/2022 | Ise | ....................... | H04N 23/633 |

\* cited by examiner

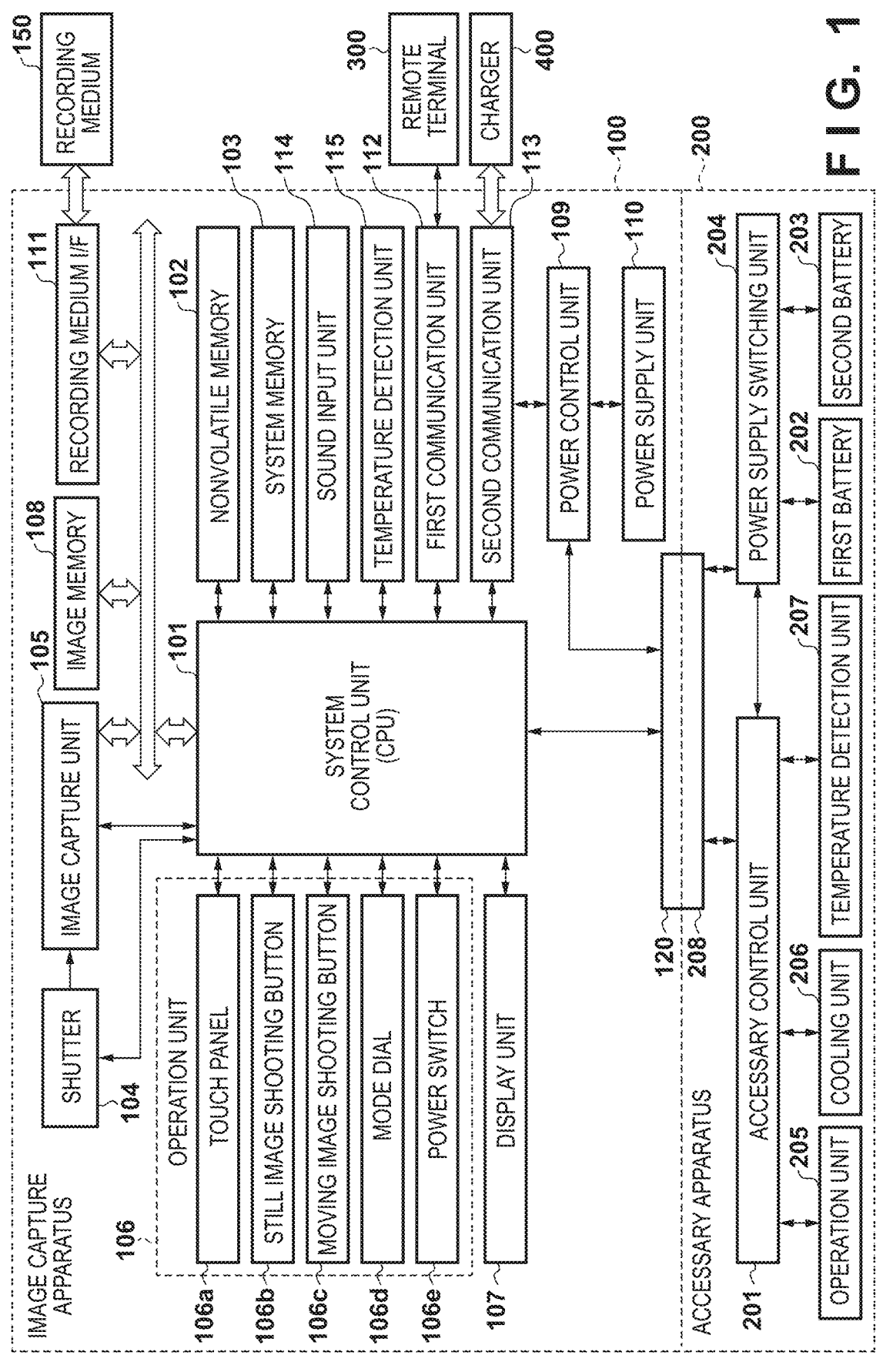
F I G. 1

F I G. 2A

| OPERATION MODE | ROTATION SPEED | |
|---|---|---|
| | EXCEPT DURING MOVING IMAGE/ SOUND RECORDING | DURING MOVING IMAGE/ SOUND RECORDING |
| MODE 1 (ON) | HIGH SPEED | HIGH SPEED |
| | | MIDDLE SPEED |
| | | LOW SPEED |
| | | STOPPED |
| MODE 2 (ON) | HIGH SPEED | |
| | MIDDLE SPEED | |
| | LOW SPEED | |
| OFF | STOPPED | |

221    222

F I G. 2B

| OPERATION MODE | ROTATION SPEED |
|---|---|
| ON | HIGH SPEED |
| OFF | STOPPED |

231    232

F I G. 3
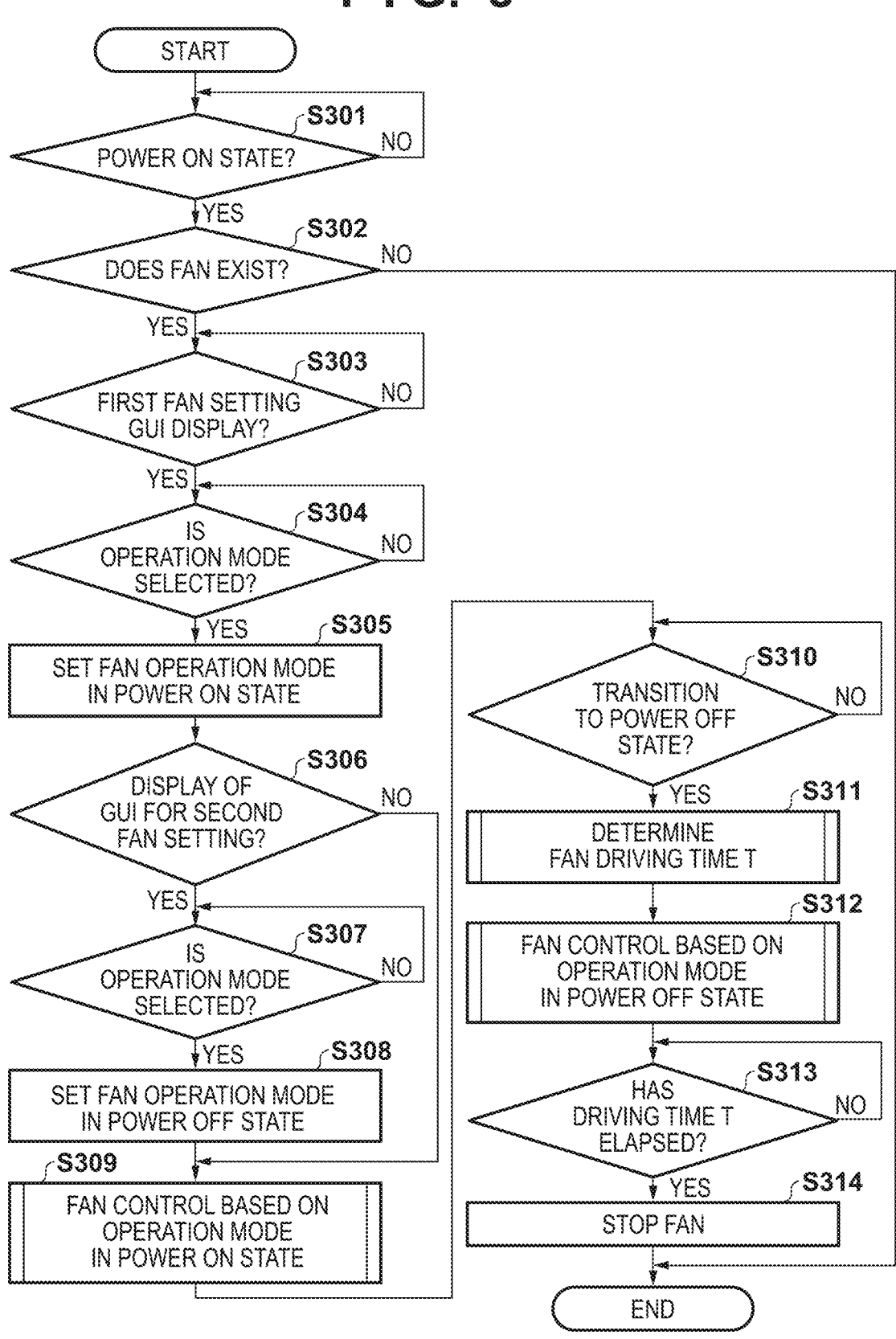

F I G. 4C

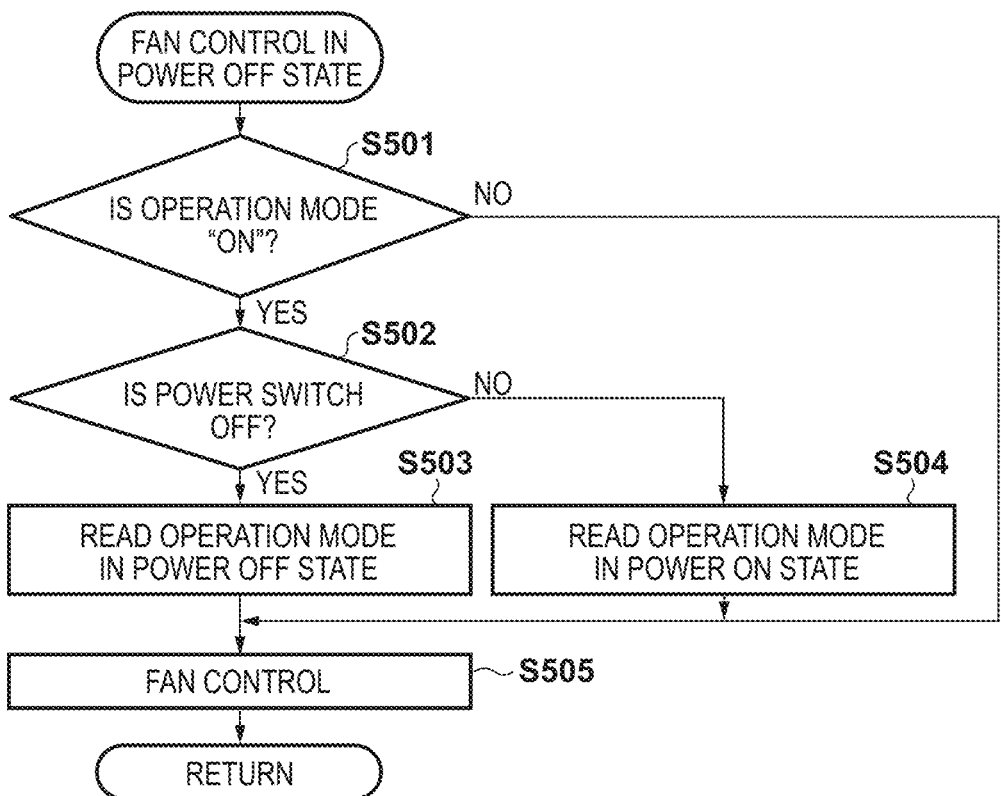

FAN CONTROL
IN MODE 1

S421
IS
MOVING IMAGE
RECORDING IN
PROGRESS?
NO

YES

S422
IS SOUND
RECORDING IN
PROGRESS?
NO

YES

S423
ROTATE FAN AT ROTATION SPEED
SET IN MODE 1

S424
ROTATE FAN AT HIGH SPEED

RETURN

F I G. 5

FAN CONTROL IN
POWER OFF STATE

S501
IS OPERATION MODE
"ON"?
NO

YES

S502
IS POWER SWITCH
OFF?
NO

YES

S503
READ OPERATION MODE
IN POWER OFF STATE

S504
READ OPERATION MODE
IN POWER ON STATE

FAN CONTROL   S505

RETURN

FIG. 6A

F I G. 6B
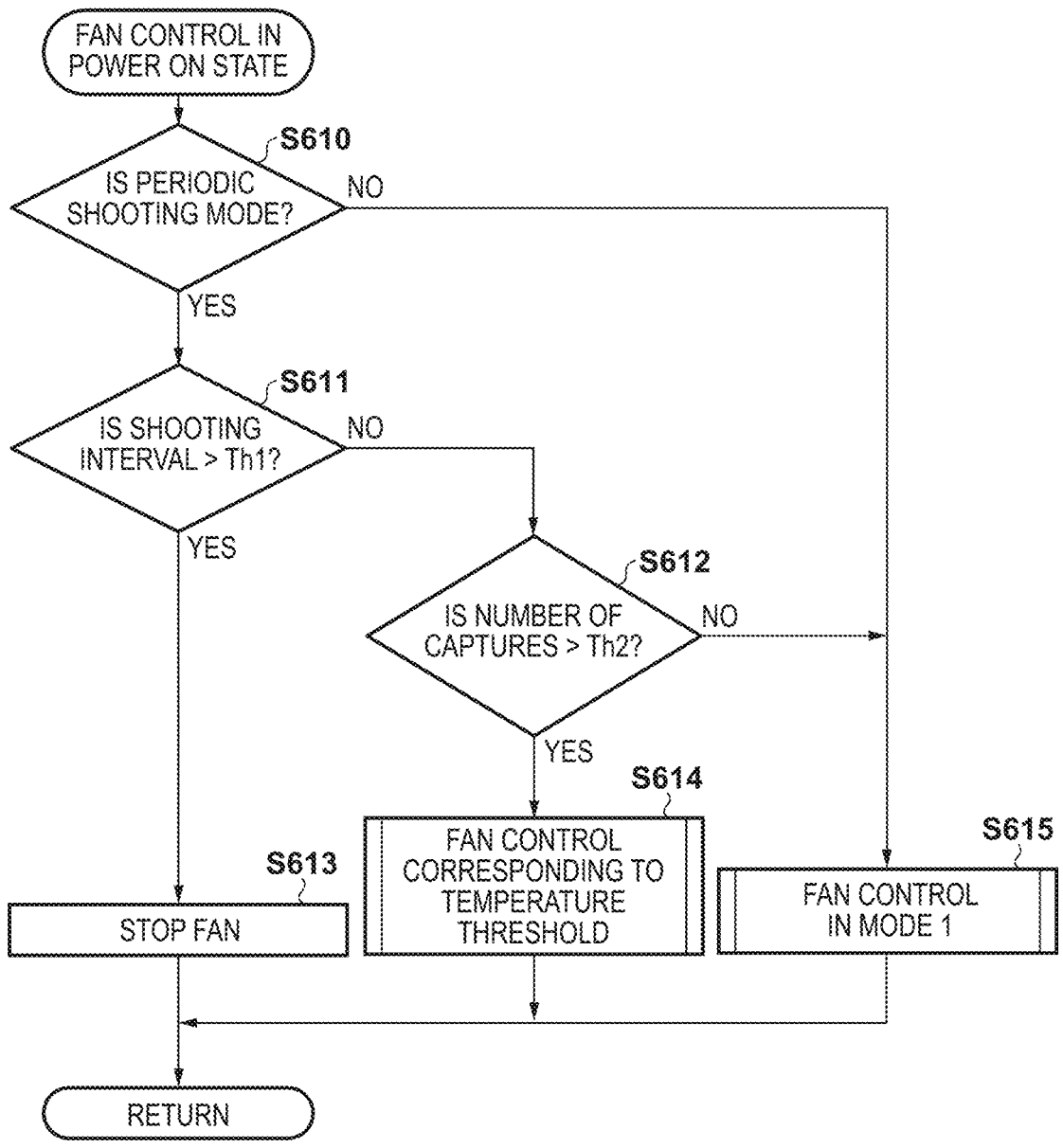

F I G.  8
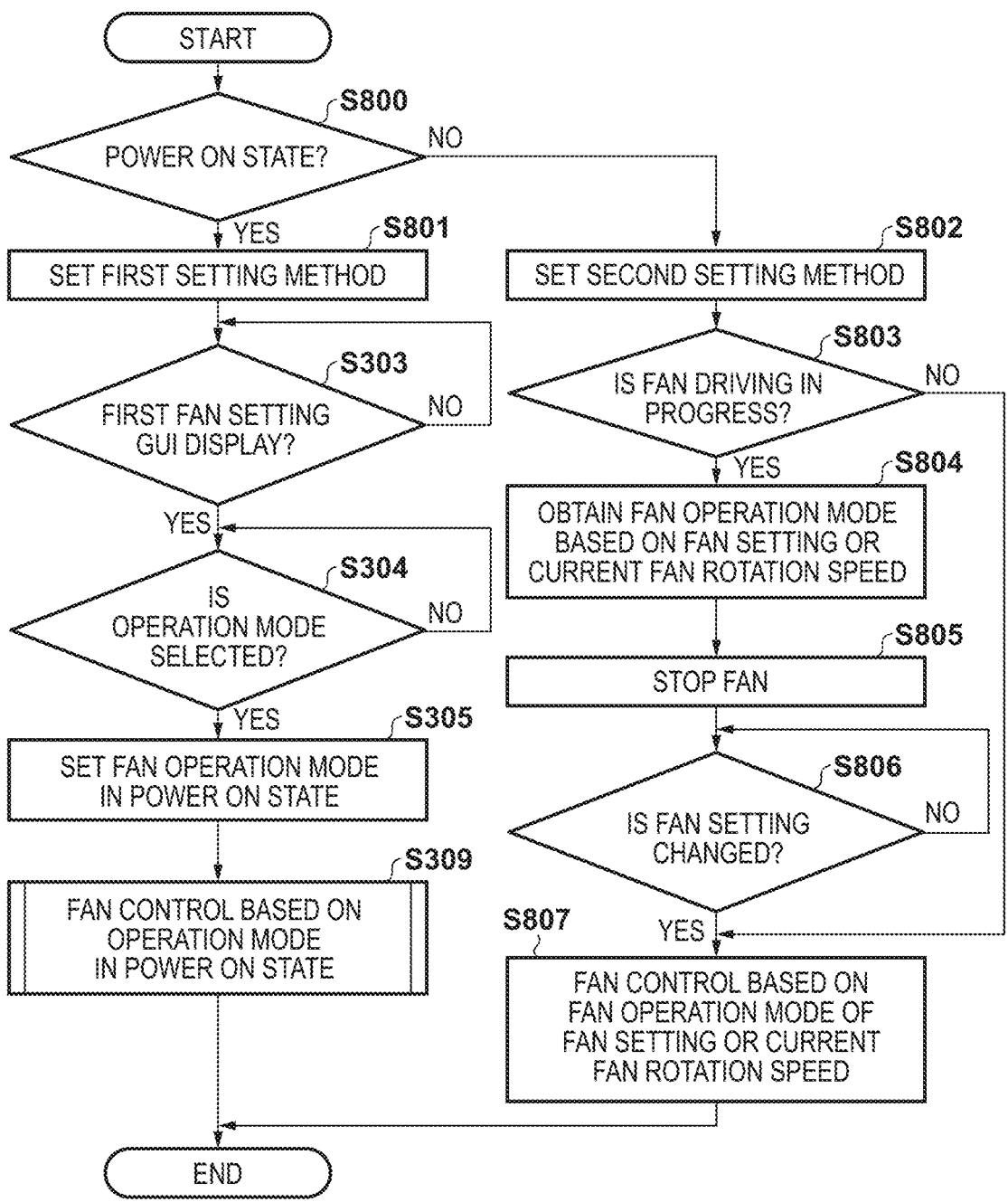

FIG. 9

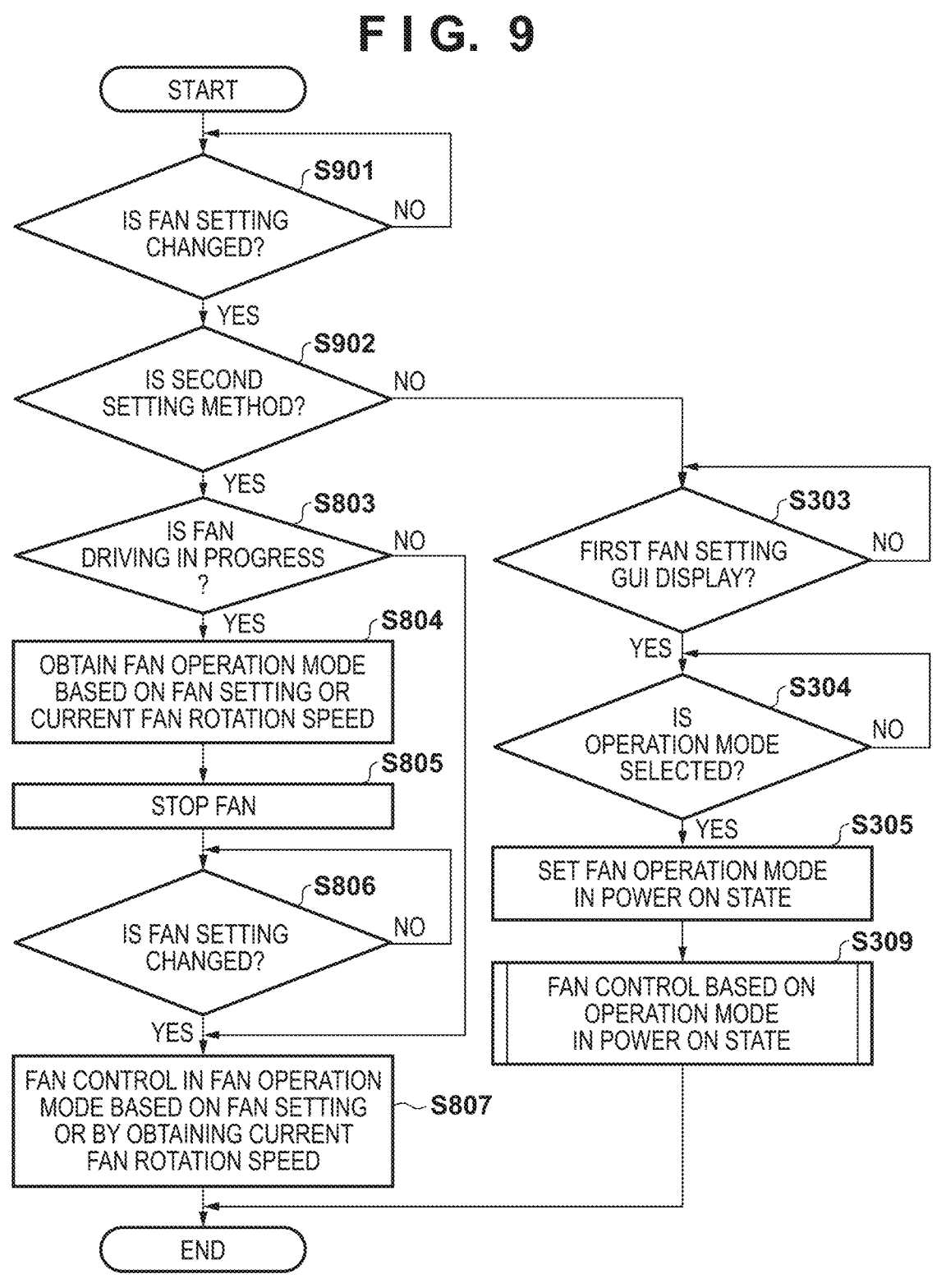

START

S901 IS FAN SETTING CHANGED? — NO

YES

S902 IS SECOND SETTING METHOD? — NO

YES

S803 IS FAN DRIVING IN PROGRESS? — NO

YES

S804 OBTAIN FAN OPERATION MODE BASED ON FAN SETTING OR CURRENT FAN ROTATION SPEED

S805 STOP FAN

S806 IS FAN SETTING CHANGED? — NO

YES

S807 FAN CONTROL IN FAN OPERATION MODE BASED ON FAN SETTING OR BY OBTAINING CURRENT FAN ROTATION SPEED

S303 FIRST FAN SETTING GUI DISPLAY? — NO

YES

S304 IS OPERATION MODE SELECTED? — NO

YES

S305 SET FAN OPERATION MODE IN POWER ON STATE

S309 FAN CONTROL BASED ON OPERATION MODE IN POWER ON STATE

END

F I G. 10

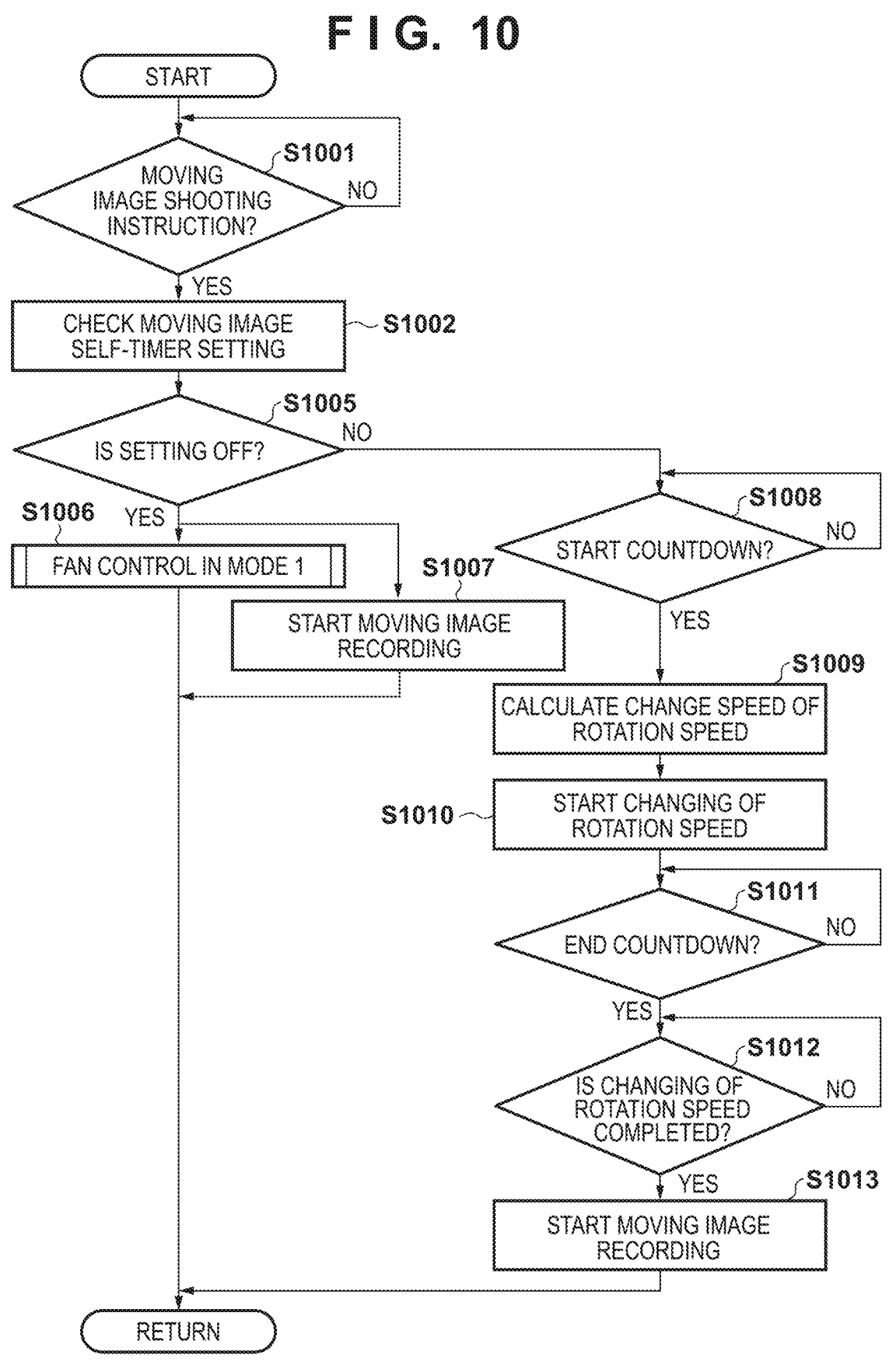

START

S1001
MOVING IMAGE SHOOTING INSTRUCTION? — NO

YES

CHECK MOVING IMAGE SELF-TIMER SETTING — S1002

S1005
IS SETTING OFF? — NO

YES

S1006
FAN CONTROL IN MODE 1

S1007
START MOVING IMAGE RECORDING

S1008
START COUNTDOWN? — NO

YES

S1009
CALCULATE CHANGE SPEED OF ROTATION SPEED

S1010
START CHANGING OF ROTATION SPEED

S1011
END COUNTDOWN? — NO

YES

S1012
IS CHANGING OF ROTATION SPEED COMPLETED? — NO

YES

S1013
START MOVING IMAGE RECORDING

RETURN

F I G. 11

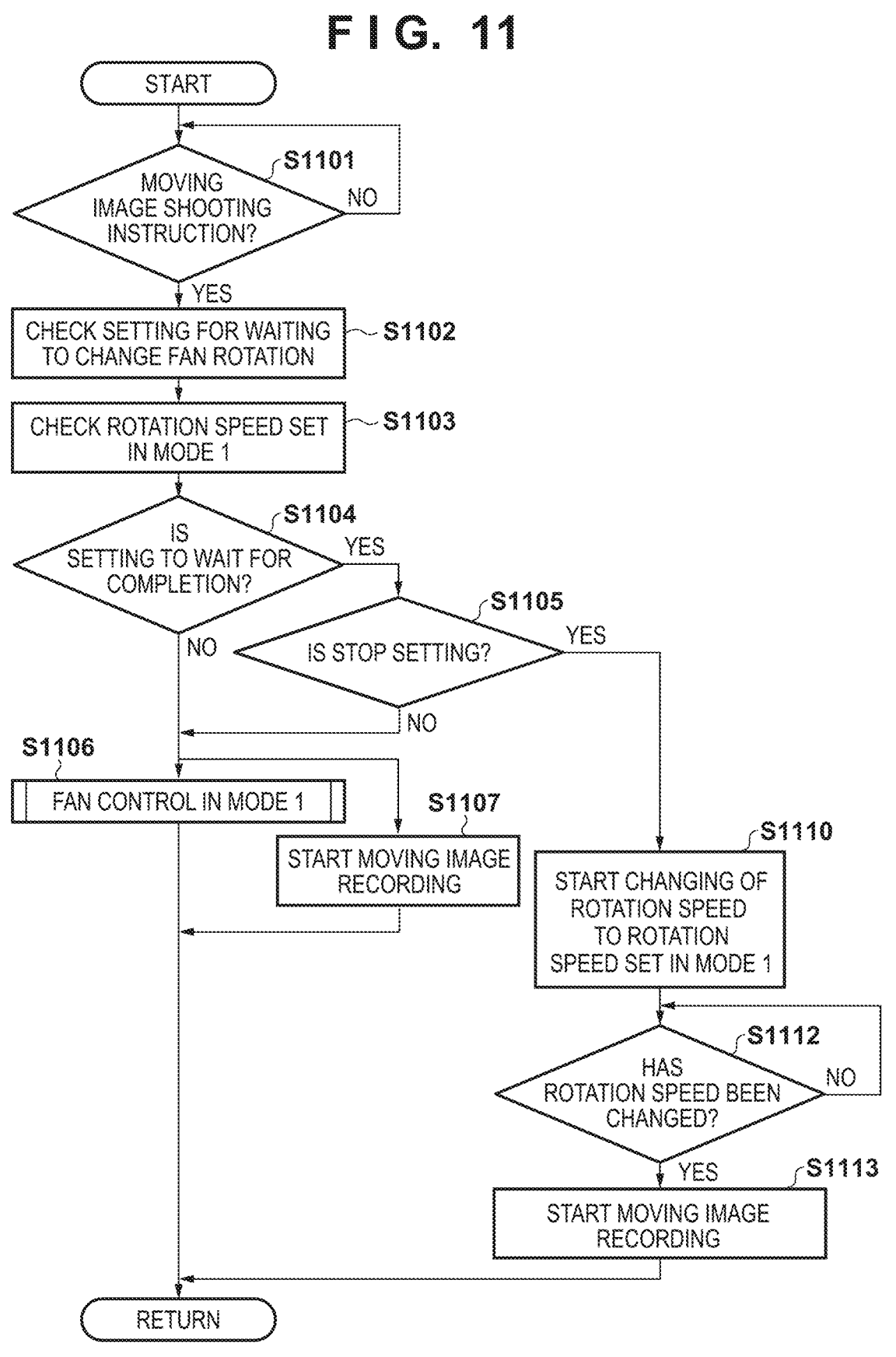

```
                    ( START )
                        │
                        ▼
                   ◇ S1101
              MOVING                    NO
         IMAGE SHOOTING  ──────────────────┐
           INSTRUCTION?                     │
                │ YES                        │
                ▼                            │
      ┌──────────────────────┐ S1102        │
      │ CHECK SETTING FOR    │              │
      │ WAITING TO CHANGE    │              │
      │ FAN ROTATION         │              │
      └──────────────────────┘              │
                │                            │
                ▼                            │
      ┌──────────────────────┐ S1103        │
      │ CHECK ROTATION SPEED │              │
      │ SET IN MODE 1        │              │
      └──────────────────────┘              │
                │                            │
                ▼                            │
           ◇ S1104                          │
         IS SETTING TO        YES            │
       WAIT FOR COMPLETION? ───────┐        │
                │ NO               ▼        │
                │            ◇ S1105        │
                │          IS STOP SETTING?  YES ──┐
                │                │ NO              │
                │◄───────────────┘                │
                ▼                                  │
   S1106 ┌──────────────────────┐                 │
         │ FAN CONTROL IN MODE 1│   S1107         │
         └──────────────────────┘                 │
                │          ┌──────────────────┐   │
                │          │ START MOVING     │   │
                │          │ IMAGE RECORDING  │   │
                │          └──────────────────┘   │
                │                  │              ▼
                │                  │       ┌──────────────────────┐ S1110
                │                  │       │ START CHANGING OF    │
                │                  │       │ ROTATION SPEED       │
                │                  │       │ TO ROTATION          │
                │                  │       │ SPEED SET IN MODE 1  │
                │                  │       └──────────────────────┘
                │                  │                  │
                │                  │                  ▼
                │                  │             ◇ S1112
                │                  │           HAS ROTATION     NO ──┐
                │                  │         SPEED BEEN CHANGED? ◄────┘
                │                  │                  │ YES   S1113
                │                  │       ┌──────────────────────┐
                │                  │       │ START MOVING IMAGE   │
                │                  │       │ RECORDING            │
                │                  │       └──────────────────────┘
                │                  │                  │
                ▼◄─────────────────┴──────────────────┘
            ( RETURN )
```

F I G. 13A
F I G. 13B
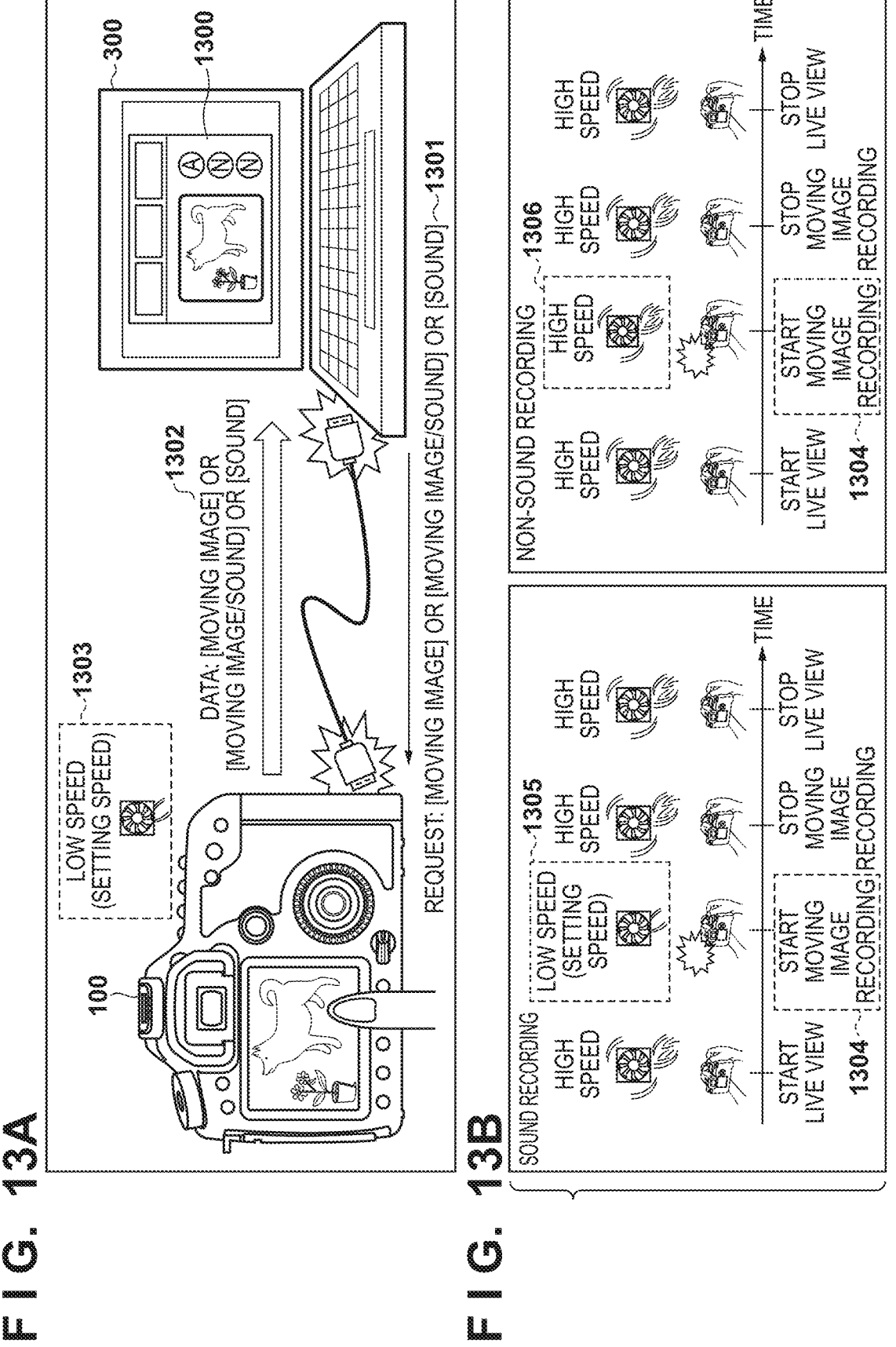

ELECTRONIC APPARATUS CAPABLE OF SETTING AN OPERATION MODE OF A COOLING UNIT AND CONTROL METHOD

BACKGROUND OF THE INVENTION

Field of the Invention

The present invention relates to a technique of cooling an electronic apparatus.

Description of the Related Art

As the functionality of an electronic apparatus such as a digital camera improves, it generates more heat. Therefore, when the temperature of the electronic apparatus exceeds a threshold temperature, the operation of the electronic apparatus is restricted and cannot be resumed until the temperature drops to the threshold temperature or less. Hence, in order to prevent excessive rise of the temperature of the electronic apparatus and shorten the time to lower the temperature of the electronic apparatus, a cooling unit such as a fan is required.

Japanese Patent Laid-Open No. 2018-94802 describes that, when a job execution time in the activation state of the electronic apparatus is equal to or longer than a predetermined time, a fan is driven for a predetermined time after transition to the standby state.

However, in Japanese Patent Laid-Open No. 2018-94802, the fan is driven after transition of the electronic apparatus to the standby state regardless of the temperature of the electronic apparatus and the necessity of cooling thereof. Accordingly, it is not possible to drive or stop the fan in consideration of a case where the user wants to prioritize cooling of the electronic apparatus, a case where the user does not want to generate fan driving sound, a case where the user wants to suppress power consumption, or the like.

By driving the fan at the maximum rotation in the standby state while decreasing the rotation speed of the fan upon starting moving image recording, it is possible to achieve both an extension of the moving image recording time owing to cooling and a reduction of the fan driving sound during sound recording. In this case, in the early stage of sound recording, the fan driving sound may not be reduced until completion of the change of the rotation speed of the fan. In addition, when sound is transmitted to an external apparatus and recorded thereby, mixing of the driving sound of the fan driven at the maximum rotation can occur during sound recording by the external apparatus.

SUMMARY OF THE INVENTION

The present invention has been made in consideration of the aforementioned problems, and implements techniques capable of variably controlling the cooling capability in accordance with the operation state of an electronic apparatus.

In order to solve the aforementioned problems, the present invention provides an electronic apparatus which can record a moving image and sound, comprising: a cooling unit that cools the apparatus; a setting unit that sets an operation mode of the cooling unit; and a control unit that controls the cooling unit based on the operation mode of the cooling unit, wherein the control unit sets the operation mode of the cooling unit set by the setting unit, when sound recording is in progress, and sets the operation mode of the cooling unit to a driving state in which a cooling capability of the cooling unit is maximum, when sound recording is not in progress.

In order to solve the aforementioned problems, the present invention provides a control method for an electronic apparatus which can record a moving image and sound, comprising: setting an operation mode of a cooling unit that cools the electronic apparatus; and controlling the cooling unit based on the operation mode of the cooling unit, wherein, in the controlling, when sound recording is in progress, the set operation mode of the cooling unit is set, and when sound recording is not in progress, the operation mode of the cooling unit is set in a driving state in which a cooling capability of the cooling unit is maximum.

According to the present invention, it is possible to variably control the cooling capability in accordance with the operation state of an electronic apparatus.

Further features of the present invention will become apparent from the following description of exemplary embodiments (with reference to the attached drawings).

BRIEF DESCRIPTION OF THE DRAWINGS

FIG. 1 is a block diagram showing the configurations of an electronic apparatus and an accessary apparatus according to the present embodiment;

FIGS. 2A and 2B are tables exemplifying the fan settings according to the first embodiment;

FIG. 3 is a flowchart showing the first example of the fan control processing according to the first embodiment;

FIGS. 4A to 4C are flowcharts showing the first example of the fan control processing in the power-on state of an electronic apparatus according to the first embodiment;

FIG. 5 is a flowchart showing the second example of the fan control processing in the power-off state of the electronic apparatus according to the first embodiment;

FIG. 6A is a flowchart showing the second example of the fan control processing in the power-on state of the electronic apparatus according to the first embodiment;

FIG. 6B is a flowchart showing the third example of the fan control processing in the power-on state of the electronic apparatus according to the first embodiment;

FIG. 8 is a flowchart showing the first example of the fan control processing according to the second embodiment;

FIG. 9 is a flowchart showing the second example of the fan control processing according to the second embodiment;

FIG. 10 is a flowchart showing the first example of the fan control processing according to the third embodiment;

FIG. 11 is a flowchart showing the second example of the fan control processing according to the third embodiment;

FIGS. 13A and 13B are views exemplifying the fan control in an external transfer mode and a moving image shooting mode according to the fourth embodiment.

DESCRIPTION OF THE EMBODIMENTS

Figure 4A:
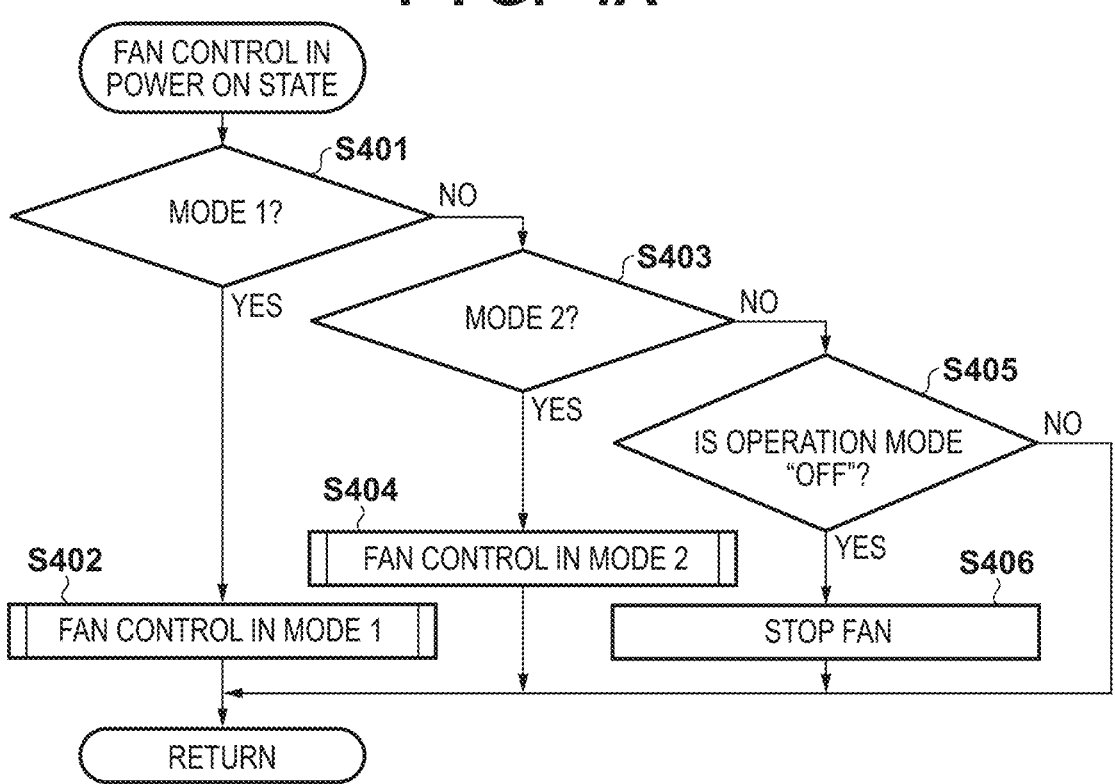

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

<System Configuration>

With reference to FIG. 1, the system configuration according to the present embodiment will be described.

The system according to the present embodiment includes an electronic apparatus 100 and an accessary apparatus 200.

The electronic apparatus 100 is an image capture apparatus such as a digital camera capable of shooting a still image and a moving image.

The accessary apparatus 200 is an external apparatus attachable/detachable to/from the electronic apparatus 100. The accessary apparatus 200 is a cooling apparatus that lowers the temperature inside the electronic apparatus 100. At the same time, the accessary apparatus 200 is a battery apparatus that supplies power to the electronic apparatus 100. Note that in the present embodiment, the configuration will be described in which the accessary apparatus 200 is formed separately from the electronic apparatus 100 and mechanically and electrically connected to the electronic apparatus 100. However, the configuration may be used in which the cooling unit of the accessary apparatus 200 is incorporated in the electronic apparatus 100.

In the present embodiment, a case will be described where the electronic apparatus 100 is a digital camera. However, the electronic apparatus 100 is not limited to a digital camera, and may be a portable communication terminal or information processing terminal such as a smartphone or a tablet computer, or another apparatus that incorporates or can be equipped with the accessary apparatus 200.

<Configurations of Electronic Apparatus and Accessory Apparatus>

Next, with reference to FIG. 1, the configuration and functions of the electronic apparatus 100 according to the present embodiment will be described.

A system control unit 101 includes a processor such as a CPU that performs arithmetic processing and control processing concerning the electronic apparatus (to be referred to as the camera, hereinafter) 100. The system control unit 101 implements respective processing operations of flowcharts (to be described later) by executing programs stored in a nonvolatile memory 102.

The nonvolatile memory 102 is an EEPROM, a flash memory, or the like capable of electrically erasing and recording data. The nonvolatile memory 102 stores constants, programs, and the like for the operation of the system control unit 101. The programs in the present embodiment are programs for executing flowcharts to be described later with reference to FIGS. 3 to 12.

A system memory 103 is an RAM or the like. Constants, variables, programs read out from the nonvolatile memory 102, and the like for the operation of the system control unit 101 are loaded in the system memory 103.

A focal plane shutter 104 can freely control the exposure time in an image capture unit 105 in accordance with the instruction of the system control unit 101.

The image capture unit 105 is an image sensor formed from an imaging element such as a CCD or CMOS which converts an object image into an electrical signal.

An operation unit 106 is an operation member including various kinds of switches, buttons, and the like, which accepts various kinds of operations from the user and notifies them to the system control unit 101. The operation unit 106 includes at least a touch panel 106a, a still image shooting button 106b, a moving image shooting button 106c, a mode dial 106d, and a power switch 106e.

The still image shooting button 106b is a push-in operation member for instructing still image shooting processing to the system control unit 101. The moving image shooting button 106c is a push-in operation member for instructing moving image shooting processing to the system control unit 101.

The mode dial 106d is a rotary operation member for switching the operation mode of the camera 100. The mode dial 106d can switch the operation mode of the camera 100 to any of a still image shooting mode, a moving image shooting mode, and a play mode.

The power switch 106e is a rotary operation member for switching power-on/off of the camera 100.

The system control unit 101 performs resizing processing such as predetermined pixel interpolation or reduction and color conversion processing with respect to image data captured by the image capture unit 105. In addition, the system control unit 101 performs arithmetic processing using the image data captured by the image capture unit 105. Based on the arithmetic result, the system control unit 101 performs automatic exposure (AE) control and autofocus (AF) control.

When the still image shooting button 106b is pressed halfway in the still image shooting mode, the system control unit 101 starts AE control and AF control. When the still image shooting button 106b is fully pressed, the system control unit 101 executes still image shooting processing of recording, in a recording medium 150, the image data captured by the image capture unit 105.

In accordance with the first press of the moving image shooting button 106c in the moving image shooting mode, the system control unit 101 performs AE control and AF control with respect to the image data (frame) captured by the image capture unit 105, and continues the moving image shooting processing of recording the moving image of a predetermined time in the recording medium 150. When the moving image shooting button 106c is pressed again, the system control unit 101 stops the moving image shooting processing.

The system control unit 101 stores, in the nonvolatile memory 102, the setting time of a moving image self-timer which is selected and set by the user operating the operation unit 106 using a GUI screen displayed on a display unit 107. In accordance with the first press of the moving image shooting button 106c in the moving image shooting mode or another arbitrary condition, the system control unit 101 checks the setting of the moving image self-timer read out form the nonvolatile memory 102. Unless the setting time is not set, the system control unit 101 starts the moving image shooting processing after the setting time elapses. The moving image self-timer measures the time from the acceptance of a moving image shooting instruction to the start of moving image shooting. Note that the moving image shooting processing includes at least one of moving image storing (recording) processing and sound storing (recording) processing.

The display unit 107 includes a liquid crystal panel, an organic EL panel, or the like provided on the back surface side of a camera main body unit 130, and displays an image, various information, and Graphical User Interface (GUI) such that the user can view them. The display unit 107 has an Electronic View Finder (EVF) function for displaying a live view image captured by the image capture unit 105. The display unit 107 also has an Electronic View Finder (EVF)

function for reproducing a captured still image and displaying a moving image being recorded.

The display unit 107 is also provided with the touch panel 106a. The touch panel 106a includes a touch sensor capable of detecting a contact (touch operation) on the display surface of the display unit 107 (the operation surface of the touch panel 106a).

An image memory 108 stores the image data captured by the image capture unit 105, and the image display data for displaying on the display unit 107. The image memory 108 has a sufficient storage capacity to store a predetermined number of still images, or moving images and sound of a predetermined time.

A power control unit 109 includes, for example, a battery detection circuit, a DC-DC converter, and a switching circuit for switching blocks to which electric power is to be supplied, and detects the presence/absence of a battery, the type of the battery, and the remaining amount of the battery. Based on the battery detection results and instructions from the system control unit 101, the power control unit 109 controls the DC-DC converter, and supplies necessary voltages to units including the recording medium 150 for necessary periods of time.

A power supply unit 110 is constituted by a primary battery such as an alkaline battery or lithium battery, a secondary battery such as an NiCd battery, NiMH battery or Li-ion battery, an AC adapter, and the like.

The power control unit 109 controls the power supplied from the power supply unit 110 to each unit of the camera 100. In a state in which the accessary apparatus 200 to be described later is attached to the camera 100, the power control unit 109 performs control to supply the power, which is supplied from the battery included in the accessary apparatus 200, to each unit of the camera 100.

A recording medium interface (I/F) 111 is an interface with the recording medium 150 such as a memory card or hard disk. The recording medium 150 is a recording medium such as a memory card for recording a still image in the still image shooting processing or a moving image in the moving image shooting processing, and is formed from a semiconductor memory, magnetic disk, or the like.

A first communication unit 112 is connected to an external apparatus such as a remote terminal 300 (to be described later) so as to be capable of mutual communication by a wireless antennal or a wired cable, and transmits and receives data. The first communication unit 112 can also be connected to a wireless Local Area Network (LAN) and the Internet. The first communication unit 112 can transmit, to the external apparatus, the image data (including the live view image) captured by the image capture unit 105, the image file recorded on the recording medium 150, and the sound data generated by a sound input unit 114 (to be described later), and can receive image data and other various information from the external apparatus. Note that the first communication unit 112 is not limited to the wireless LAN, and may use a wireless communication interface such as infrared communication, Bluetooth®, Bluetooth Low Energy, or Wireless USB, or a wired connection interface such as a USB cable, HDMI®, or IEEE 1394. Note that the remote terminal 300 is an external apparatus connected to the camera 100 to remotely operate and control the camera 100. The remote terminal 300 is, for example, an information processing apparatus like a personal computer (desktop PC or notebook PC) or a mobile apparatus such as a tablet PC, a smartphone, a smartwatch, or smartglasses. A second communication unit 113 is an interface complying with, for example, a USB Power Delivery (USB PD)

standard, which is used to connect the camera 100 to an external apparatus such as a charger 400. The second communication unit 113 can perform data communication and power transfer with an external apparatus complying with the USB PD standard. The charger 400 is a charger powered by a commercial power supply or a battery, and supplies power to the camera 100 via the second communication unit 113.

The sound input unit 114 includes one or a plurality of microphones incorporated in the camera 100 or connected to the camera 100 via a sound terminal. The sound input unit 114 converts the analog sound signal, which is generated by collecting sound around the camera 100, into a digital signal, and outputs the digital signal to the system control unit 101.

The system control unit 101 performs various kinds of sound processing operations on the digital sound signal generated by the sound input unit 114, thereby generating sound data. Further, the system control unit 101 can record the sound data generated during moving image shooting in synchronization with the moving image data, or record only the moving image data without synchronization with the sound data.

In a state of being connected to an external apparatus such as the remote terminal 300 so as to be capable of mutual communication, the system control unit 101 can transition to an external transfer mode for transmitting the sound data generated by the sound input unit 114 to the external apparatus. The system control unit 101 transitions to the external transfer mode in accordance with a user operation or another condition. In the external transfer mode, when the connection to the external apparatus is disconnected, the system control unit 101 stops the external transfer mode. In the external transfer mode, in response to a sound data transmission request received from the external apparatus, the system control unit 101 transmits the sound data generated by the sound input unit 114 to the external apparatus.

A temperature detection unit 115 is a sensor, such as a thermistor sensor or a bimetal sensor, that measures the temperature of a predetermined portion of the camera 100, converts the temperature into a physical amount such as a voltage or a resistance value, and outputs it.

The power control unit 109 controls the power supplied to each unit of the camera 100 in accordance with the power supply state of the camera 100. The power supply state of the camera 100 includes a state in which the power switch 106e is turned on and the camera 100 is activated (power-on state) and a state in which the power switch 106e is turned off and the camera 100 is not activated (power-off state). Further, the power-off state of the camera 100 includes an auto power-off state in which the camera 100 is powered off when no operation is detected for a predetermined time in the activation state of the camera 100, and a state in which power supply is stopped due to the operation restriction based on the temperature of the camera 100.

The power control unit 109 performs control to supply the power, which is supplied from the charger 400 via the second communication unit 113, to each unit of the camera 100. The power control unit 109 also uses the power supplied from the charger 400 via the second communication unit 113 to control charging of the power supply unit 110. Further, in the state in which the accessary apparatus 200 (to be described later) is attached to the camera 100, the power control unit 109 can supply, to the accessary apparatus 200, the power supplied from the charger 400 via the second communication unit 113, thereby charging the battery of the accessary apparatus 200. Even in the power-off state of the camera 100, the power control unit 109 can charge the battery using the power supplied from the charger 400 via the second communication unit 113.

In the power-off state of the camera 100, the power control unit 109 stops the power supply to each unit of the camera 100, and the system control unit 101 transitions to a low power consumption state (sleep state). When the power switch 106e is switched from the power-off state to the power-on state, the system control unit 101 is supplied with power, thereby recovering from the sleep state. In the auto power-off state of the camera 100, it recovers to the power-on state with an operation of the operation member included in the operation unit 106 or communication control from the remote terminal 300 as a trigger. The camera 100 may recover to the power-on state based on other arbitrary external factors. Even in the power-off state of the camera 100, the power control unit 109 can charge the battery using the power supplied from the charger 400 via the second communication unit 113.

A connection unit 120 is an adapter mechanically and electrically connected to a connection unit 208 of the accessary apparatus 200 to be described later. The connection unit 120 includes a communication terminal for connection to the accessary apparatus 200 so as to be capable of mutual communication, and a power supply terminal for power reception from the accessary apparatus 200.

Next, with reference to FIG. 1, the configuration and functions of the accessary apparatus 200 according to the present embodiment will be described.

The accessary apparatus 200 includes an accessary control unit 201, a first battery 202, a second battery 203, a power supply switching unit 204, an operation unit 205, a cooling unit 206, a temperature detection unit 207, and the connection unit 208.

The accessary control unit 201 includes a processor such as a CPU that performs arithmetic processing and control processing concerning the accessary apparatus 200, and a memory storing constants, programs, and the like for operation of the accessary apparatus 200.

Each of the first battery 202 and the second battery 203 supplies power to the accessary apparatus 200 and the camera 100. Each of the first battery 202 and the second battery 203 is constituted by a primary battery such as an alkaline battery or lithium battery, a chargeable secondary battery such as an NiCd battery, NiMH battery or Li-ion battery, and the like.

The power supply switching unit 204 switches the battery to supply power and the battery to be charged to the first battery 202 or the second batter 203 based on an instruction of the accessary control unit 201.

The operation unit 205 is an operation member including various kinds of switches, buttons, a touch panel, and the like, which accepts various kinds of operations to the accessary apparatus 200 from the user and notifies them to the accessary control unit 201. The operation unit 205 includes operation members similar to those included in the operation unit 106 of the camera 100, and an operation member that can change the control setting of the fan of the cooling unit 206 (to be referred to as the fan setting hereinafter).

The cooling unit 206 includes the fan which is driven to rotate by the power from the first battery 202 or the second batter 203. The cooling unit 206 sends cooling air generated by the rotation of the fan into the housings of the accessary apparatus 200 and the camera 100 to lower the temperatures of the accessary apparatus 200 and the camera 100.

The temperature detection unit 207 is a sensor, such as a thermistor sensor or a bimetal sensor, that measures the temperature of a predetermined portion of the accessary apparatus 200, converts the temperature into a physical amount such as a voltage or a resistance value, and outputs it.

The connection unit 208 is a connector mechanically and electrically connected to the connection unit 120 of the camera 100. The connection unit 208 includes a communication terminal for connection to the camera 100 so as to be capable of mutual communication, and a power supply terminal for power supply to the camera 100.

The accessary control unit 201 periodically acquires the detected temperature from the temperature detection unit 207 of the accessary apparatus 200, and transmits it to the system control unit 101 of the camera 100. The system control unit 101 determines the drive/stop of the fan and the rotation speed thereof based on the fan setting of the cooling unit 206 and the detected temperature of the temperature detection unit 207, and transmits an instruction to the accessary control unit 201. Based on the instruction of the system control unit 101, the accessary control unit 201 controls the fan of the cooling unit 206. The fan setting of the cooling unit 206 is set based on FIG. 2 to be described later.

Note that, in the power-off state (including auto power-off state) of the camera 100, the accessary control unit 201 stops the power supply to each unit of the accessary apparatus 200, and the accessary control unit 201 transitions to a low power consumption state (sleep state). The accessary control unit 201 is set in the power-off state due to the operation restriction based on the temperature of the accessary apparatus 200.

Note that a plurality of the cooling units 206 and temperature detection units 207 may be distributed at different portions in the housings of the accessary apparatus 200 and the camera 100. Alternatively, the cooling unit 206 may be provided in the housing of the camera 100, and the system control unit 101 may be configured to control the fan. Alternatively, the accessary control unit 201 may receive the fan setting from the system control unit 101, and control the fan based on the fan setting and the detected temperature of the temperature detection unit 207.

First Embodiment

Next, with reference to FIGS. 2A to 7B in addition to FIG. 1, the fan control processing according to the first embodiment will be described.

In the first embodiment, the fan setting of a cooling unit 206 in the power-on state of a camera 100 and the fan setting of the cooling unit 206 in the power-off state of the camera 100 are possible. Further, in a state in which an accessary apparatus 200 is attached to the camera 100, the fan of the cooling unit 206 of the accessary apparatus 200 is controlled based on the power supply state of the camera 100 and the fan setting.

FIGS. 2A and 2B exemplify the fan settings corresponding to the power supply states of the camera 100.

The user can select and set one of the operation modes of the fan settings shown in FIGS. 2A and 2B by operating a GUI displayed on a display unit 107 via an operation member included in an operation unit 106. In addition, the user can select and set one of the operation modes of the fan settings shown in FIGS. 2A and 2B by operating a GUI displayed on the display unit (not shown) of a remote terminal 300.

FIG. 2A exemplifies the first fan setting in the power-on state of the camera 100.

The first fan setting shown in FIG. 2A includes a plurality of driving states and a stop state. As for the first fan setting, one of mode 1, mode 2, and "OFF" can be selected as a fan operation mode 221, and one of "high speed", "middle speed", "low speed", and "stop" can be selected as a fan rotation speed 222. The first fan setting shown in FIG. 2A is used in the fan control processing shown in FIGS. 4A and 4C to be described later. When the fan operation mode 221 is mode 1, "high speed" alone is set as the fan rotation speed 222 except during moving image/sound recording, and one of "high speed", "middle speed", "low speed", and "stop" can be selected during moving image/sound recording. Note that the options during moving image/sound recording may include items other than these four items. When the fan operation mode 221 is mode 2, one of "high speed", "middle speed", and "low speed" can be selected as the rotation speed 222. When the fan operation mode 221 is changed from mode 1 to mode 2 while the fan rotation speed 222 is set, the fan rotation speed 222 is maintained. However, when "stop" is selected in mode 1, when the fan operation mode 221 is changed to mode 2, the fan rotation speed 222 is changed to "low speed", and when the fan operation mode 221 is returned to mode 1, the fan rotation speed 222 is returned to "stop". Note that the cooling capability of the cooling unit 206 changes in accordance with the fan rotation speed 222. When the fan rotation speed 222 is "high speed", the cooling capability of the cooling unit 206 is maximum. When the fan rotation speed 222 is "middle speed", the cooling capability of the cooling unit 206 is smaller than in the case of the fan rotation speed 222 being "high speed" and larger than in the case of the fan rotation speed 222 being "low speed". When the fan rotation speed 222 is "low speed", the cooling capability of the cooling unit 206 is smaller than the case of the fan rotation speed 222 being "high speed" or "middle speed". When the fan rotation speed 222 is "stop", the fan rotation speed 222 is zero (non-rotation), and the cooling capability of the cooling unit 206 is minimum. Note that the first fan setting shown in FIG. 2A is not limited to the illustrated example, and the fan operation mode 221 may include two or fewer options, or three or more options. The names of modes are not limited to "mode 1" and "mode 2", and may be arbitrary names. For example, the names may be "high speed during standby" instead "mode 1", and "user setting speed" instead of "mode 2".

FIG. 2B exemplifies the second fan setting in the power-off state of the camera 100.

The second fan setting shown in FIG. 2B includes a driving state and a stop state. As for the second fan setting, one of "ON" and "OFF" can be selected as a fan operation mode 231. The second fan setting shown in FIG. 2B is used in the fan control processing shown in FIG. 4B to be described later. When the fan operation mode 231 is "ON", "high speed" alone can be set as a fan rotation speed 232. When the fan operation mode 231 is "OFF", the fan rotation speed 232 is zero (non-rotation), and the fan is stopped. Note that, in the fan operation mode 231, the cooling capability of the cooling unit 206 changes in accordance with the fan rotation speed 232. When the fan rotation speed 232 is "high speed", the cooling capability of the cooling unit 206 is maximum. Note that the second fan setting shown in FIG. 2B is not limited to the illustrated example, and the fan rotation mode 231 may include less than two options, or two or more options.

The fan settings shown in FIGS. 2A and 2B are stored in a nonvolatile memory 102. The fan setting selected by the user is kept stored in the nonvolatile memory 102 even after the camera 100 is powered-off. When the camera 100 is powered-on again, the stored fan setting is read out from the nonvolatile memory 102 and used in the fan control processing.

A system control unit 101 of the camera 100 determines the fan rotation speed of the cooling unit 206 of the accessary apparatus 200 based on the fan setting, and transmits it to an accessary control unit 201. The accessary control unit 201 drives the fan based on the fan rotation speed received from the system control unit 101.

FIG. 3 is a flowchart showing the first example of the fan control processing according to the first embodiment.

Note that the processing shown in FIG. 3 is implemented when the system control unit 101 of the camera 100 loads a program stored in the nonvolatile memory 102 to a system memory 103 and executes it to control respective components of the camera 100. Note that a part of the control processing shown in FIG. 3 is implemented when the system control unit 101 transmits an instruction to the accessary control unit 201 of the accessary apparatus 200, and the accessary control unit 201 executes a program stored in a memory to control respective components of the accessary apparatus 200. This also applies to FIGS. 4A to 9 to be described later.

In step S301, the system control unit 101 waits until it determines that the camera 100 is in the power-on state (activation state). When the camera 100 is determined to be in the power-on state, the system control unit 101 advances the processing to step S302.

In step S302, the system control unit 101 determines whether the accessary apparatus 200 attached to the camera 100 includes the cooling unit 206, or whether the camera 100 includes a cooling unit including a fan. When the system control unit 101 determines that the accessary apparatus 200 includes the cooling unit 206 or the camera 100 includes a cooling unit, the system control unit 101 advances the processing step S303. When the system control unit 101 determines that the accessary apparatus 200 does not include the cooling unit 206 and the camera 100 does not include a cooling unit, the processing ends.

In step S303, the system control unit 101 waits until it determines that an instruction to display a GUI based on the first fan setting shown in FIG. 2A on the display unit 107 is received by a user operation via the operation unit 106. When it is determined that the instruction to display the GUI based on the first fan setting shown in FIG. 2A is received, the system control unit 101 advances the processing to step S304.

In step S304, the system control unit 101 waits until it determines that one of the operation modes of the first fan setting shown in FIG. 2A is selected by a user operation via the operation unit 106. When the system control unit 101 determines that one of the operation modes of the first fan setting shown in FIG. 2A is selected, the system control unit 101 advances the processing to step S305.

In step S305, the system control unit 101 sets the fan operation mode in the power-on state of the camera 100 to the fan operation mode selected in step S304, and the system control unit 101 advances the processing to step S306.

In step S306, the system control unit 101 determines whether an instruction to display a GUI based on the second fan setting shown in FIG. 2B on the display unit 107 is received by a user operation via the operation unit 106. When the system control unit 101 determines that the instruction to display the GUI based on the second fan setting shown in FIG. 2B is received, the system control unit 101 advances the processing to step S307. When the system control unit 101 determines that the instruction to display the GUI based on the second fan setting shown in FIG. 2B is not received, the system control unit 101 advances the processing to step S309.

In step S307, the system control unit 101 waits until it determines that one of the operation modes of the second fan setting shown in FIG. 2B is selected by a user operation via the operation unit 106. When the system control unit 101 determines that one of the operation modes of the second fan setting shown in FIG. 2B is selected, the system control unit 101 advances the processing to step S308.

In step S308, the system control unit 101 sets the fan operation mode in the power-off state of the camera 100 to the fan operation mode selected in step S306, and the system control unit 101 advances the processing to step S309.

In step S309, based on the fan operation mode in the power-on state of the camera 100 set in step S305, the system control unit 101 determines the fan rotation speed of the cooling unit 206 of the accessary apparatus 200, and transmits it to the accessary control unit 201. The accessary control unit 201 controls the rotation speed of the fan based on the fan rotation speed received from the system control unit 101. Note that the system control unit 101 may directly control the fan of the cooling unit 206 of the accessary apparatus 200.

In step S310, the system control unit 101 waits until it determines that the camera 100 transitions to the power-off state. When it is determined that the camera 100 transitions to the power-off state, the system control unit 101 advances the processing to step S311.

In step S311, the system control unit 101 determines a fan driving time T in the power-off state of the camera 100, and transmits it to the accessary apparatus 200. The fan driving time T is set as the time required for the temperature of the camera 100 to drop to a temperature threshold or less after the power-off of the camera 100. More specifically, the fan driving time T is calculated as the time required for the temperature information, which is acquired from a temperature detection unit 115 of the camera 100, to drop to a threshold temperature or less in a case where the residual amount of a first battery 202 or a second battery 203 of the accessary apparatus 200 is equal to or larger than a threshold at the timing of the power-off of the camera 100.

In step S312, based on the fan operation mode in the power-off state of the camera 100 set in step S308, the system control unit 101 determines the fan rotation speed of the cooling unit 206 of the accessary apparatus 200, and transmits it to the accessary control unit 201. The accessary control unit 201 controls the rotation speed of the fan based on the fan rotation speed received from the system control unit 101. Note that the system control unit 101 may directly control the fan of the cooling unit 206 of the accessary apparatus 200.

In step S313, the accessary control unit 201 waits until it determines that the driving time T determined in step S311 has elapsed since driving of the fan is started in step S312. When the accessary control unit 201 determines that the driving time T has elapsed, the system control unit 101 advances the processing to step S314.

In step S314, the accessary control unit 201 stops driving of the fan, and the processing ends.

FIG. 4A is a flowchart showing the first example of the fan control processing in step S309 of FIG. 3.

In step S401, the system control unit 101 determines whether the fan operation mode set in step S305 is mode 1 shown in FIG. 2A. When the system control unit 101 determines that the fan operation mode set in step S305 is mode 1, the system control unit 101 advances the processing to step S402. When the system control unit 101 determines that the fan operation mode set in step S305 is not mode 1, the system control unit 101 advances the processing to step S403.

In step S402, the system control unit 101 executes the fan control corresponding to mode 1, and the processing ends. The fan control corresponding to mode 1 will be described later with reference to FIG. 4C.

In step S403, the system control unit 101 determines whether the fan operation mode set in step S305 is mode 2 shown in FIG. 2A. When the system control unit 101 determines that the fan operation mode set in step S305 is mode 2, the system control unit 101 advances the processing to step S404. When the system control unit 101 determines that the fan operation mode set in step S305 is not mode 2, the system control unit 101 advances the processing to step S405.

In step S404, the system control unit 101 executes the fan control corresponding to mode 2, and the processing ends. Note that, in the fan control corresponding to mode 2, the fan may be controlled at the fan rotation speed selected by the user, or may be controlled at an arbitrary rotation speed different from the rotation speed in mode 1.

In step S405, the system control unit 101 determines whether the fan operation mode set in step S305 is "OFF" shown in FIG. 2A. When the system control unit 101 determines that the fan operation mode set in step S305 is "OFF", the system control unit 101 advances the processing to step S406. When the system control unit 101 determines that the fan operation mode set in step S305 is not "OFF", the processing ends.

In step S406, the system control unit 101 transmits, to the accessary control unit 201, an instruction to stop driving of the fan. The accessary control unit 201 stops driving of the fan based on the instruction to stop driving of the fan received from the system control unit 101.

Note that, in each of steps S402, S404, and S406, the system control unit 101 may directly control the fan of the cooling unit 206 of the accessary apparatus 200.

Figure 4B:
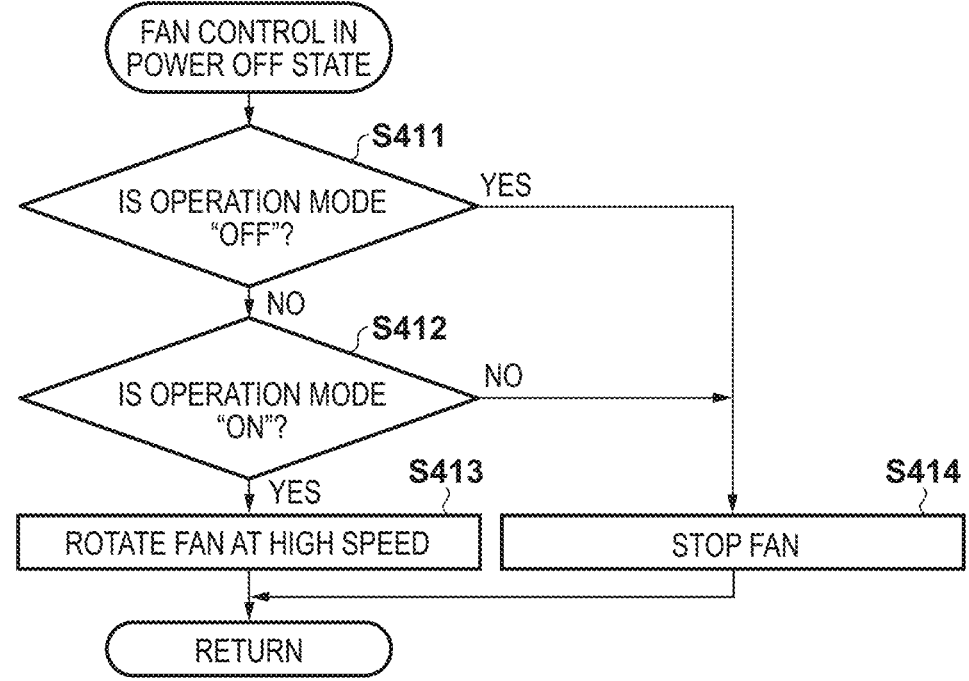

FIG. 4B is a flowchart showing the first example of the fan control processing in step S312 of FIG. 3.

In step S411, the system control unit 101 determines whether the fan operation mode set in step S308 is "OFF" shown in FIG. 2B. When the system control unit 101 determines that the fan operation mode set in step S308 is "OFF", the system control unit 101 advances the processing to step S414. When the system control unit 101 determines that the fan operation mode set in step S308 is not "OFF", the system control unit 101 advances the processing to step S412.

In step S412, the system control unit 101 determines whether the fan operation mode set in step S308 is "ON" shown in FIG. 2B. When the system control unit 101 determines that the fan operation mode set in step S308 is "ON", the system control unit 101 advances the processing to step S413. When the system control unit 101 determines that the fan operation mode set in step S308 is not "ON", the system control unit 101 advances the processing to step S414. Note that the fan operation mode 231 of the second fan setting shown in FIG. 2B may be selectable not only from two options of "ON" and "OFF" but also from two or more options suitable for the fan control.

In step S413, based on the fan operation mode in the power-on state of the camera 100 set in step S308, the system control unit 101 determines the fan rotation speed of the cooling unit 206 of the accessary apparatus 200 to "high speed", and transmits it to the accessary control unit 201. The accessary control unit 201 controls the rotation speed of the fan to the high speed based on the fan rotation speed received from the system control unit 101. Note that the system control unit 101 may instruct the accessary apparatus 200 to continue the rotation speed of the fan at the fan rotation speed in the power-on state of the camera 100 determined in step S309.

In step S414, based on the fan operation mode in the power-off state of the camera 100 set in step S308, the system control unit 101 transmits an instruction to stop driving of the fan to the accessary control unit 201. Based in the instruction to stop driving of the fan received from the system control unit 101, the accessary control unit 201 stops driving of the fan.

Note that, in each of steps S413 and S414, the system control unit 101 may directly control the fan of the cooling unit 206 of the accessary apparatus 200.

FIG. 4C is a flowchart showing the fan control processing corresponding to mode 1, which is performed in step S402 of FIG. 4A.

In step S421, the system control unit 101 determines whether moving image shooting is in progress in the camera 100. When the system control unit 101 determines that moving image shooting is in progress in the camera 100, the system control unit 101 advances the processing to step S422. When the moving image shooting is not in progress, the system control unit 101 advances the processing to step S424.

In step S422, the system control unit 101 determines whether sound recording is in progress in the camera 100. When the system control unit 101 determines that sound recording is in progress in the camera 100, the system control unit 101 advances the processing to step S423. When the sound recording is not in progress, the system control unit 101 advances the processing to step S424.

In step S423, the system control unit 101 executes the fan control in mode 1 of the fan operation mode shown in FIG. 2A at the fan rotation speed selected by the user, and the processing ends.

In step S424, the system control unit 101 executes the fan control in mode 1 of the fan operation mode shown in FIG. 2A at the fan rotation speed selected to "high speed" by the user or the fan rotation speed forcibly set to "high speed". Note that the rotation speed of the fan may be increased or decreased in accordance with the temperature of the camera 100.

Note that, in each of steps S423 and S424, the system control unit 101 may directly control the fan of the cooling unit 206 of the accessary apparatus 200.

FIG. 5 is a flowchart showing the second example of the fan control processing in step S312 of FIG. 3.

In step S501, the system control unit 101 determines whether the fan operation mode set in step S308 is "ON" shown in FIG. 2B. When the system control unit 101 determines that the fan operation mode set in step S308 is "ON", the system control unit 101 advances the processing to step S502. When the system control unit 101 determines that the fan operation mode set in step S308 is not "ON", the system control unit 101 advances the processing to step S505.

In step S502, the system control unit 101 determines whether the camera 100 transitions to the power-off state in step S310 of FIG. 3 because a power switch 106e is turned off. When the system control unit 101 determines that the camera 100 transitions to the power-off state in step S310 of FIG. 3 because the power switch 106e is turned off, the system control unit 101 advances the processing to step S503. When the system control unit 101 determines that the camera 100 transitions to the power-off state in step S310 of FIG. 3 not because the power switch 106e is turned off, the system control unit 101 advances the processing to step S504. When the camera 100 transitions to the power-off state not because the power switch 106e is turned off, the camera 100 is, for example, in the auto power-off state.

In step S503, the system control unit 101 stores, in the system memory 103, the fan operation mode in the power-off state of the camera 100 set in step S308, and the system control unit 101 advances the processing to step S505.

In step S504, the system control unit 101 stores, in the system memory 103, the fan operation mode in the power-on state of the camera 100 set in step S305, and the system control unit 101 advances the processing to step S505. Note that the system control unit 101 may read out the fan rotation speed at the time of executing the processing in step S504, and store it in the system memory 103.

In step S505, the system control unit 101 determines the fan rotation speed of the cooling unit 206 of the accessary apparatus 200 based on the fan operation mode stored in the system memory 103, and transmits it to the accessary control unit 201. The accessary control unit 201 controls the fan based on the fan rotation speed received from the system control unit 101.

Figure 6A:
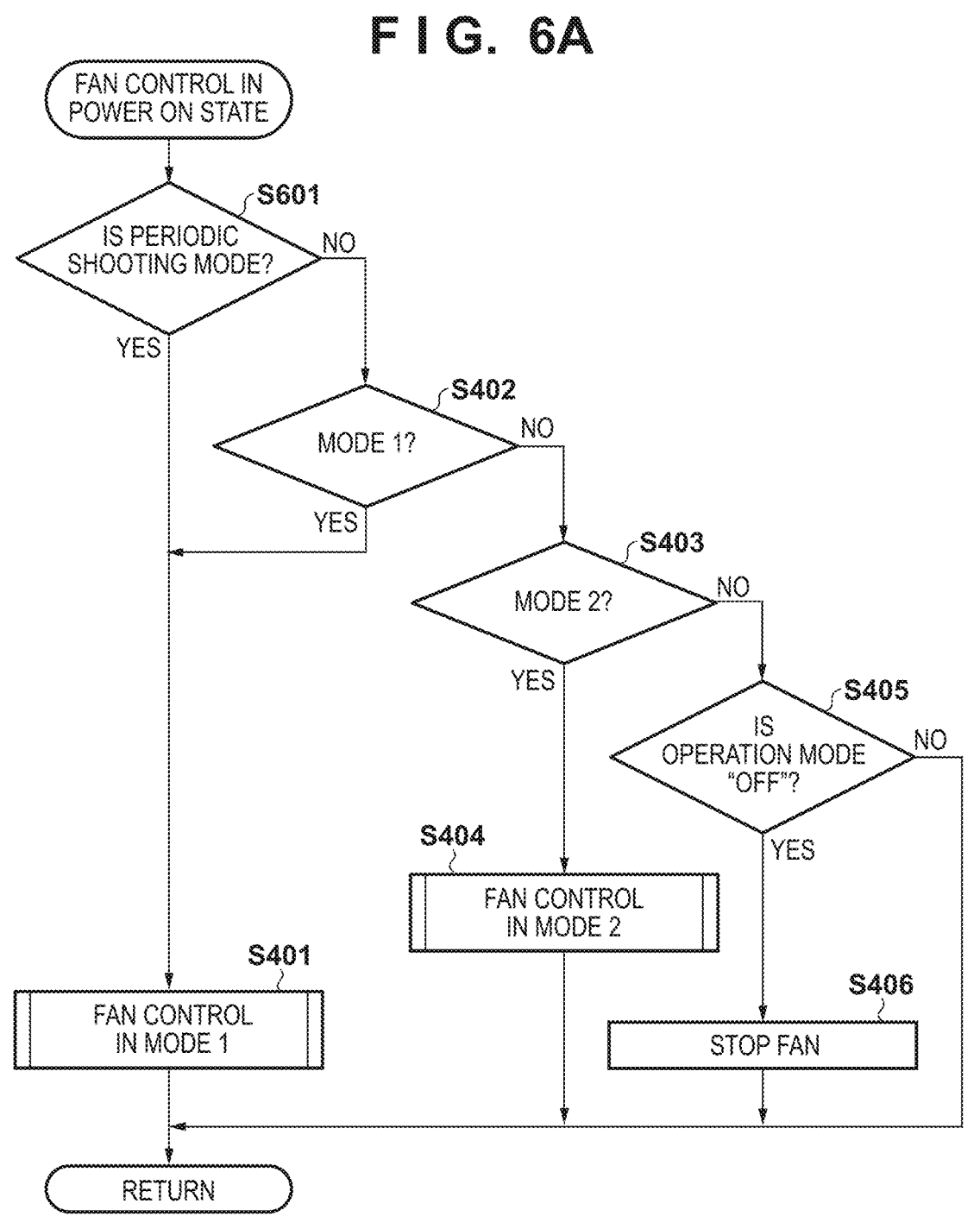

FIG. 6A is a flowchart showing the second example of the fan control processing in step S309 of FIG. 3.

In step S601, the system control unit 101 determines whether the camera 100 is in a periodic shooting mode. When the system control unit 101 determines that the camera 100 is in the periodic shooting mode, the system control unit 101 advances the processing to step S401. When the camera 100 is not in the periodic shooting mode, the system control unit 101 advances the processing to step S402. The periodic shooting mode is, for example, a mode of performing shooting at a predetermined shooting interval and a predetermined number of times of shooting, like time-lapse shooting.

The processing from step S401 to step S406 of FIG. 6 is similar to the processing from step S401 to step S406 of FIG. 4A.

FIG. 6B is a flowchart showing the third example of the fan control processing in step S309 of FIG. 3.

In step S610, the system control unit 101 determines whether the camera 100 is in the periodic shooting mode. When the system control unit 101 determines that the camera 100 is in the periodic shooting mode, the system control unit 101 advances the processing to step S611. When the camera 100 is not in the periodic shooting mode, the system control unit 101 advances the processing to step S615.

In step S611, the system control unit 101 determines whether the shooting interval of the camera 100 is equal to or larger than a threshold Th1. When the system control unit 101 determines that the shooting interval of the camera 100 is equal to or larger than the threshold Th1, the system control unit 101 advances the processing to step S613. When the system control unit 101 determines that the shooting interval of the camera 100 is smaller than the threshold Th1, the system control unit 101 advances the processing to step S612.

In step S612, the system control unit 101 determines whether the number of times of shooting of the camera 100 is equal to or larger than a threshold Th2. When the system control unit 101 determines that the number of times of shooting of the camera 100 is equal to or larger than the threshold Th2, the system control unit 101 advances the processing to step S614. When the system control unit 101 determines that the number of times of shooting of the camera 100 is smaller than the threshold Th2, the system control unit 101 advances the processing to step S615.

In step S613, the system control unit 101 transmits an instruction to stop driving of the fan to the accessary control unit 201. The accessary control unit 201 stops driving of the fan based on the instruction to stop driving of the fan received from the system control unit 101.

In step S614, the system control unit 101 determines the fan rotation speed corresponding to the temperature threshold of the camera 100, and transmits it to the accessary control unit 201. The accessary control unit 201 controls the rotation speed of the fan based on the fan rotation speed received from the system control unit 101. The fan rotation speed corresponding to the temperature threshold of the camera 100 is changed when one of the temperature information acquired from the temperature detection unit 115 of the camera 100 and the temperature information acquired from a temperature detection unit 207 of the accessary apparatus 200 exceeds the threshold temperature or falls below the threshold temperature.

In step S615, the system control unit 101 performs fan control based on mode 1 shown in FIG. 4C, and the processing ends.

Note that, in each of steps S613, S614, and S615, the system control unit 101 may directly control the fan of the cooling unit 206 of the accessary apparatus 200.

Figure 7A:
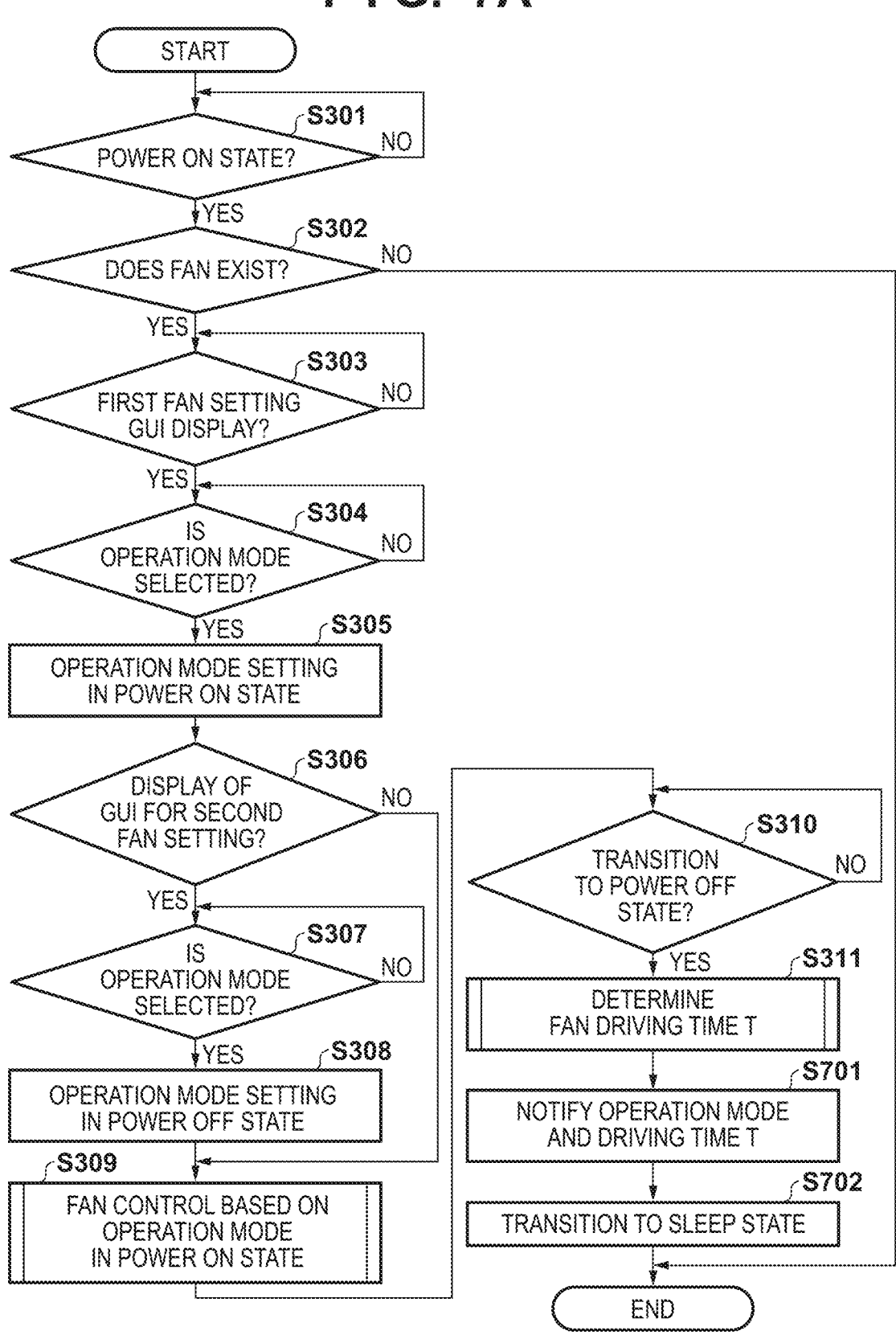
FIGS. 7A and 7B are flowcharts showing the second example of the fan control processing according to the first embodiment.
Figure 7B:
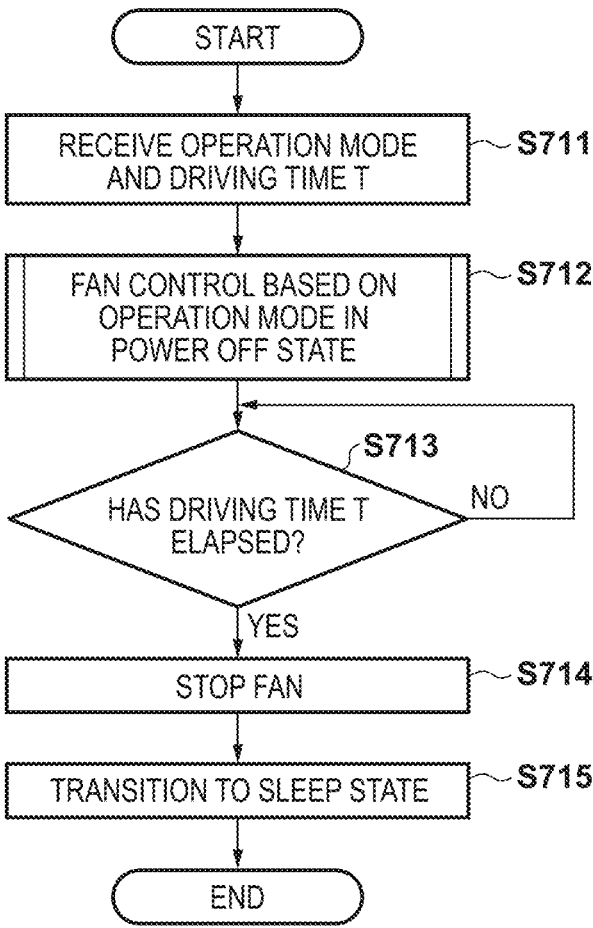

FIGS. 7A and 7B are flowcharts showing the second example of the fan control processing according to the first embodiment.

FIG. 7A is a flowchart showing the processing of the camera 100.

The processing from step S301 to step S311 of FIG. 7A is similar to the processing from step S301 to step S311 of FIG. 3.

In step S701, the system control unit 101 notifies the fan operation mode set in step S308 and the driving time T determined in step S312 to the accessary apparatus 200, and the system control unit 101 advances the processing to step S702.

In step S702, the system control unit 101 stops the power supply to each unit of the camera 100 and transitions to the sleep state, and the processing ends.

FIG. 7B is a flowchart showing the processing of the accessary apparatus 200.

In step S711, the accessary control unit 201 receives the fan operation mode and the driving time T from the camera 100, and the system control unit 101 advances the processing to step S712.

In step S712, the accessary control unit 201 determines the fan rotation speed of the cooling unit 206 based on the fan operation mode received in step S711, and controls the rotation speed of the fan based on the determined fan rotation speed.

In step S713, the accessary control unit 201 waits until it determines that the driving time T received in step S711 has elapsed elapses since driving of the fan is started in step S712. When the accessary control unit 201 determines that the driving time T has elapsed, the system control unit 101 advances the processing to step S714.

In step S714, the accessary control unit 201 stops driving of the fan, and the system control unit 101 advances the processing to step S715.

In step S715, the accessary control unit 201 stops the power supply to each unit of the accessary apparatus 200 and transitions to the sleep state, and the processing ends.

As has been described above, according to the first embodiment, it is possible to variably control the cooling capability of the cooling unit 206 in accordance with the operation state of the camera 100. With this, while enabling cooling in the power-off state of the camera 100, it is possible to drive or stop the fan in consideration of cases in the power-on state of the camera 100, for example, a case where the user wants to prioritize cooling of the camera 100, a case where the user does not want to generate fan driving sound, a case where the user wants to suppress power consumption, and the like.

Second Embodiment

Next, with reference to FIGS. 8 and 9 in addition to FIGS. 1 to 2B, the second embodiment will be described.

In the second embodiment, in the power-on state of a camera 100, the fan setting can be set by the first setting method via a display unit 107 or the display unit (not shown) of an accessary apparatus 200. In addition, in the power-off state of the camera 100 with the display unit in the non-display state, the fan setting can be set by the second setting method without intervening the display unit.

The first setting method is a method of setting the fan setting by operating a GUI displayed on the display unit 107 of the camera 100 or a GUI displayed on the display unit (not shown) of a remote terminal 300. The second setting method is a method of setting the fan setting by an operation unit 106 of the camera 100 or an operation unit 205 of the accessary apparatus 200. The second setting method can change the fan setting already set by the first setting method, for example, stop or resume driving of the fan. Note that each the operation unit 106 of the camera 100 and the operation unit 205 of the accessary apparatus 200 is a rotary, push-type, or slide-type operation member that operates mechanically. The operation unit 106 may be an operation member that can set the fan setting when the accessary apparatus 200 is attached to the camera 100, but is assigned with a use different from the fan setting when the accessary apparatus 200 is not attached to the camera 100.

Note that the apparatus configurations and the contents of the fan settings according to the second embodiment are similar to those shown in FIGS. 1 to 2B.

FIG. 8 is a flowchart showing the first example of the fan control processing according to the second embodiment.

In step S800, a system control unit 101 determines whether the camera 100 is in the power-on state. When the system control unit 101 determines that the camera 100 is in the power-on state, the system control unit 101 advances the processing to step S801. When the system control unit 101 determines that the camera 100 is not in the power-on state, the system control unit 101 advances the processing to step S802.

In step S801, the system control unit 101 sets the first setting method as the method for setting the fan setting, and the system control unit 101 advances the processing to step S803.

In step S802, the system control unit 101 sets the second setting method as the method for setting the fan setting, and the system control unit 101 advances the processing to step S803.

In step S803, the system control unit 101 determines whether the fan is being driven. When it is determined that the fan is being driven, the system control unit 101 advances the processing to step S804. When it is determined that the fan is not being driven, the system control unit 101 advances the processing to step S807.

In step S804, the system control unit 101 acquires the fan operation mode based on the fan setting already set by operating the GUI displayed on the display unit 107 or the GUI displayed on the display unit (not shown) of the remote terminal 300, or the current rotation speed of the fan, and the system control unit 101 advances the processing to step S805.

In step S805, the system control unit 101 transmits an instruction to stop driving of the fan to an accessary control unit 201. The accessary control unit 201 stops driving of the fan based on the instruction to stop driving of the fan received from the system control unit 101.

In step S806, the system control unit 101 waits until it determines that a setting change of the fan setting is instructed by the operation unit 106 of the camera 100 or the operation unit 205 of the accessary apparatus 200. When the system control unit 101 determines that a setting change of the fan setting is instructed by the operation unit 106 of the camera 100 or the operation unit 205 of the accessary apparatus 200, the system control unit 101 advances the processing to step S807.

In step S807, the system control unit 101 executes the fan control based on the fan setting acquired in step S804 or the fan setting set in step S806, and the processing ends.

The processing from step S303 to step S305 and the processing in step S309 in FIG. 8 are similar to the processing from step S303 to step S305 and the processing in step S309 of FIG. 3, respectively.

As has been described above, according to the first example of the second embodiment, in the power-on state of the camera 100, the fan setting can be set by the first setting method via the display unit, and in the power off-state of the camera 100 with the display unit in the non-display state, it is possible to drive or stop the fan by the second setting method without intervening the display unit. In this manner, it is possible to variably control the cooling capability of a cooling unit 206 in accordance with the operation state of the camera 100. With this, it is possible to drive or stop the fan in consideration of a case where the user wants to prioritize cooling of the camera 100, a case where the user does not want to generate fan driving sound, a case where the user wants to suppress power consumption, or the like.

FIG. 9 is a flowchart showing the second example of the fan control processing according to the second embodiment.

In step S901, the system control unit 101 determines whether the fan setting is changed by a user operation, and waits until it determines that the fan setting is changed. When it is determined that the fan setting is changed, the system control unit 101 advances the processing to step S901.

In step S902, the system control unit 101 determines whether the fan setting changed in step S901 is set by the first setting method or the second setting method. When the system control unit 101 determines that the fan setting is changed by the first setting method, the system control unit 101 advances the processing to step S303. When the system control unit 101 determines that the fan setting is changed by the second setting method, the system control unit 101 advances the processing to step S803.

The processing from step S303 to step S309 of FIG. 9 is similar to the processing from step S303 to step S309 of FIG. 3. The processing from step S803 to step S807 of FIG. 9 is similar to the processing from step S803 to step S807 of FIG. 8.

As has been described above, according to the second example of the second embodiment, it is possible to set the fan setting by the first setting method via the display unit. When the display unit is in the non-display state, it is possible to drive or stop the fan by the second setting method without intervening the display unit. In this manner, it is possible to variably control the cooling capability of the cooling unit 206 in accordance with the operation state of the camera 100. With this, it is possible to drive or stop the fan in consideration of a case where the user wants to prioritize cooling of the camera 100, a case where the user does not want to generate fan driving sound, a case where the user wants to suppress power consumption, or the like.

Third Embodiment

Next, with reference to FIGS. 10 and 11 in addition to FIGS. 1 to 2B, the third embodiment will be described.

In the third embodiment, a user can select and set one of the operation modes of the fan setting shown in FIG. 2A by operating a GUI displayed on a display unit 107 via an operation member included in an operation unit 106.

Note that the apparatus configurations and the contents of the fan settings according to the third embodiment are similar to those shown in FIGS. 1 to 2B.

FIG. 10 is a flowchart showing the first example of the fan control processing according to the third embodiment.

Note that the processing shown in FIG. 10 is implemented when a system control unit 101 of a camera 100 loads a program stored in a nonvolatile memory 102 to a system memory 103 and executes it to control respective components of the camera 100. Note that a part of the control processing shown in FIG. 10 is implemented when the system control unit 101 transmits an instruction to an accessary control unit 201 of an accessary apparatus 200, and the accessary control unit 201 executes a program stored in a memory to control respective components of the accessary apparatus 200. This also applies to FIG. 11 to be described later.

In step S1001, the system control unit 101 waits until it determines that the camera 100 receives a moving image shooting instruction. When it is determined that the camera 100 receives a moving image shooting instruction, the system control unit 101 advances the processing to step S1002. The moving image shooting instruction may be notified in accordance with the first press of a moving image shooting button 106c in a moving image shooting mode, or may be another arbitrary method.

In step S1002, the system control unit 101 reads out the setting time of a moving image self-timer stored in the nonvolatile memory 102, and the system control unit 101 advances the processing to step S1005.

In step S1005, the system control unit 101 determines whether the setting of the moving image self-timer read out in step S1002 is "OFF". When the system control unit 101 determines that the setting of the moving image self-timer is "OFF", the system control unit 101 advances the processing to step S1006 and step S1007. When the system control unit 101 determines that the setting of the moving image self-timer is not "OFF", the system control unit 101 advances the processing to step S1008.

In step S1006, the system control unit 101 performs the fan control corresponding to mode 1 shown in FIG. 4C, and the processing ends. The fan control corresponding to mode 1 is as described in the first embodiment.

In step S1007, the system control unit 101 starts the moving image shooting processing, and the processing ends.

Note that the moving image shooting processing includes at least one of moving image storing (recording) processing and sound storing (recording) processing.

In step S1008, the system control unit 101 determines whether countdown of the setting time of the moving image self-timer is started. When it is determined that the countdown is started, the system control unit 101 advances the processing to step S1009. When the countdown is not started, the system control unit 101 returns the processing to step S1008.

In step S1009, based on the difference between the fan rotation speed set by the user in mode 1 shown in FIG. 2A and the current rotation speed of the fan, and the setting time of the moving image self-timer, the system control unit 101 calculates a change speed X to complete changing the rotation speed within the setting time, and the system control unit 101 advances the processing to step S1011. When changing the rotation speed will be completed within the setting time, the change speed X may be a default change speed.

In step S1010, the system control unit 101 starts, at the change speed X, changing the rotation speed based on the fan rotation speed set by the user in mode 1 shown in FIG. 2A, and the system control unit 101 advances the processing to step S1011. The start timing of changing the rotation speed can be an arbitrary timing during the countdown period. For example, the difference between the setting time of the moving image self-timer and the time required to change the rotation speed is obtained. When the time corresponding to the difference has elapsed in the countdown, changing the rotation speed may be started.

In step S1011, the system control unit 101 determines whether the countdown is finished. When it is determined that the countdown is finished, the system control unit 101 advances the processing to step S1012. When the countdown is not finished, the system control unit 101 returns the processing to step S1011.

In step S1012, the system control unit 101 determines whether the rotation change based on the fan rotation speed started in step S1010 is completed. When the rotation change is completed, the system control unit 101 advances the processing to step S1013. When the rotation change is not completed, the system control unit 101 returns the processing to step S1012. Here, without waiting for the rotation change, the processing may advance to step S1013 when the setting time of the moving image self-timer elapses.

In step S1013, the system control unit 101 starts the moving image shooting processing, and the processing ends.

FIG. 11 is a flowchart showing the second example of the fan control processing according to the third embodiment.

In step S1101, the system control unit 101 waits until it determines that the camera 100 receives a moving image shooting instruction. When it is determined that the camera 100 receives a moving image shooting instruction, the system control unit 101 advances the processing to step S1102. The moving image shooting instruction is notified to the system control unit 101 in accordance with the first press of the moving image shooting button 106c or another arbitrary condition in the moving image shooting mode.

In step S1102, the system control unit 101 reads out the setting value of the fan rotation change completion wait setting stored in the nonvolatile memory 102, and the system control unit 101 advances the processing to step S1103. The fan rotation change completion wait setting can be select and set by the user using the GUI whether to wait for completion of the change of the rotation speed to the fan rotation speed set in mode 1, or to start moving image shooting without waiting for the completion. The setting value is stored in the nonvolatile memory 102. For example, the selectable options may be these two options, may be selectable for each rotation speed set by the user in FIG. 2A, or may include an option to wait for completion of the change of the rotation speed only when one of some options for a rotation speed 222 set by the user in FIG. 2A is set. The selectable options are merely examples, and other arbitrary options may be included.

In step S1103, the system control unit 101 reads out the setting value of the rotation speed 222 set by the user for the first fan setting shown in FIG. 2A, and the system control unit 101 advances the processing to step S1004.

In step S1104, the system control unit 101 determines whether the setting value of the fan rotation change completion wait setting read out in step S1102 is the completion wait setting. When it is determined that the setting value is not the completion wait setting, the system control unit 101 advances the processing to step S1106 and step S1107. When the setting value is the completion wait setting, the system control unit 101 advances the processing to step S1105.

In step S1105, the system control unit 101 determines whether the setting value of the rotation speed 222 read out in step S1103 is "stop". When it is determined that the setting value is not "stop", the system control unit 101 advances the processing to step S1106 and step S1107. When it is determined the setting value is "stop", the system control unit 101 advances the processing to step S1110. Here, the setting of the rotation speed 222 may be determined based on whether it is "stop", or may be determined based on whether it is an arbitrary setting value of the rotation speed 222. For example, the processing may advance to step S1110 only when the rotation speed 222 for avoiding mixing of fan driving sound during sound recording is set. Alternatively, the processing may advance to step S1110 only when the rotation speed 222, for which the setting value selected in step S1102 indicates to wait for the completion, is set.

In step S1106, the system control unit 101 executes the fan control in mode 1 shown in FIG. 4C, and the processing ends. The fan control in mode 1 is as described in the first embodiment.

In step S1107, the system control unit 101 starts the moving image shooting processing, and the processing ends.

In step S1110, the system control unit 101 starts changing the rotation speed to the fan rotation speed set by the user in mode 1, and the system control unit 101 advances the processing to step S1112.

In step S1112, the system control unit 101 determines whether the rotation change to the fan rotation speed started in step S1110 is completed. When the rotation change is completed, the system control unit 101 advances the processing to step S1113. When the rotation change is not completed, the system control unit 101 returns the processing to step S1112.

In step S1113, the system control unit 101 starts the moving image shooting processing, and the processing ends.

As has been described above, according to the third embodiment, it is possible to variably control the cooling capability of a cooling unit 206 in accordance with the operation state of the camera 100. With this, when the camera 100 is not recording a moving image (during standby), the fan is driven at the maximum speed to maximize the cooling capability of the fan, thereby enabling long-term moving image recording. Further, upon starting moving image recording, the rotation speed of the fan is lowered to reduce fan driving sound. Hence, it is possible to reduce mixing of fan driving sound during sound recording without bothering the user. Thus, the cooling control along with user's intention can be performed.

Fourth Embodiment

Next, with reference to FIGS. 12 to 13B in addition to FIGS. 1 to 2B, the fourth embodiment will be described.

In the fourth embodiment, a user can select and set one of the operation modes of the fan setting shown in FIG. 2A by operating a GUI displayed on a display unit 107 via an operation member included in an operation unit 106.

Note that the apparatus configurations and the contents of the fan settings according to the fourth embodiment are similar to those shown in FIGS. 1 to 2B.

Figure 12:
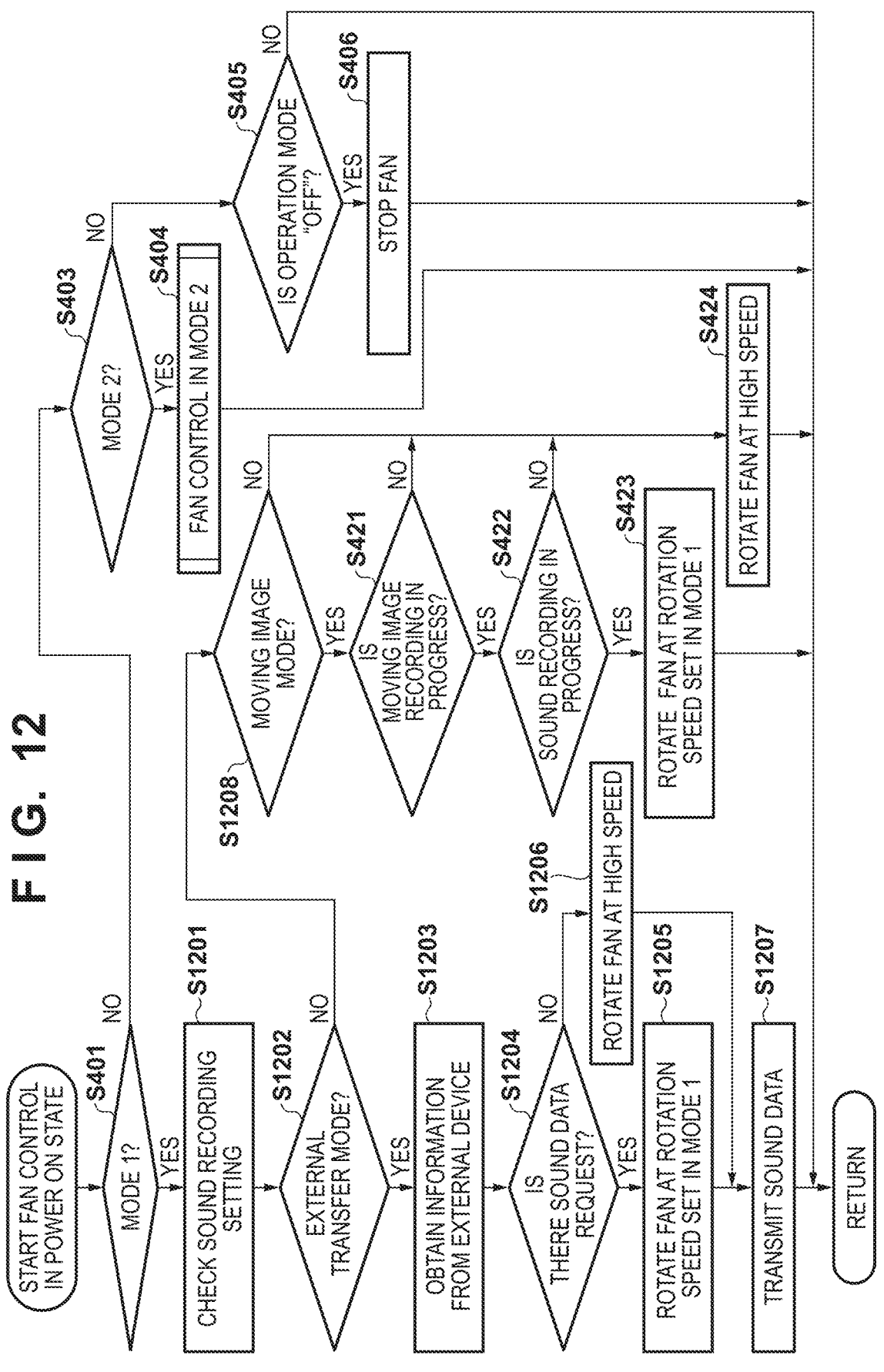
FIG. 12 is a flowchart showing the fan control processing according to the fourth embodiment.

FIG. 12 is a flowchart showing the fan control processing according to the fourth embodiment.

Note that the processing shown in FIG. 12 is implemented when a system control unit 101 of a camera 100 loads a program stored in a nonvolatile memory 102 to a system memory 103 and executes it to control respective components of the camera 100. Note that a part of the control processing shown in FIG. 12 is implemented when the system control unit 101 transmits an instruction to an accessary control unit 201 of an accessary apparatus 200, and the accessary control unit 201 executes a program stored in a memory to control respective components of the accessary apparatus 200.

FIG. 13A exemplifies the data requested from a remote terminal 300 and the data transmitted to the remote terminal 300 in a state in which the camera 100 is connected to the remote terminal 300 in an external transfer mode. FIG. 13B shows an example in which the fan control is changed in accordance with the moving image recording state.

The processing in step S401 and the processing from step S403 to step S406 of FIG. 12 are similar to the processing in step S401 and the processing from step S403 to step S406 of FIG. 4A, respectively.

Note that when the system control unit 101 determines in step S401 that mode 1 is set, the system control unit 101 advances the processing to step S1201.

In step S1201, the system control unit 101 acquires the current sound recording setting ("ON" or "OFF") already set by operating the GUI displayed on the display unit 107 or the GUI displayed on the display unit (not shown) of the remote terminal 300, and the system control unit 101 advances the processing to step S1202.

In step S1202, the system control unit 101 determines whether the operation mode of the camera 100 is the external transfer mode. Based on the connection of the camera 100 to an external terminal or a user operation using the GUI displayed on the display unit 107 or the display unit (not shown) of the remote terminal 300, the system control unit 101 determines whether the operation mode of the camera 100 is set in the external transfer mode. When the system control unit 101 determines that the operation mode of the camera 100 is the external transfer mode, the system control unit 101 advances the processing to step S1203. When the operation mode of the camera 100 is not the external transfer mode, the system control unit 101 advances the processing to step to S1208.

In step S1203, the system control unit 101 acquires various information such as a request 1301 for data to be used by an application 1300, which is received when the user operates the application 1300 in the remote terminal 300 or the like connected by a communication unit 112 as shown in FIG. 13A, and the system control unit 101 advances the processing to step S1204.

In step S1204, the system control unit 101 determines whether the various information acquired in step S1203 includes information requesting transmission of sound data. In this embodiment, the system control unit 101 determines whether it receives a sound data transmission request by identifying the USB communication standard. The system control unit 101 identifies whether the USB communication standard indicates sound data requesting information such as USB Audio Class (UAC), video (image) requesting information such as USB Video Class (UVC), or sound and video (image) requesting information such as UAC/UVC. When the system control unit 101 determines that the USB communication standard indicates UAC for requesting sound data, the system control unit 101 advances the processing to step S1205. When the system control unit 101 determines that the USB communication standard does not indicate UAC for requesting sound data, the system control unit 101 advances the processing to step S1206.

The processing in step S1205 and the processing in step S1206 of FIG. 12 are similar to the processing in step S423 and the processing in step S424 of FIG. 4C, respectively.

In step S1205, as indicated by the fan control shown in FIG. 4A, the system control unit 101 changes the rotation speed of the fan to a rotation speed 1303 set by the user.

In step S1207, based on the various information requested from the remote terminal 300 or the like connected by the communication unit 112, the system control unit 101 transmits the sound data generated by a sound input unit 114 and/or the image data (moving image data) captured by an image capture unit 105 to the remote terminal 300 as data 1302 shown in FIG. 13A, and the processing ends.

In step S1208, the system control unit 101 determines whether the operation mode of the camera 100 is the moving image shooting mode. When it is determined that the operation mode of the camera 100 is the moving image shooting mode, the system control unit 101 advances the processing to step S421. When it is determined that the operation mode of the camera 100 is not the moving image shooting mode, the system control unit 101 advances the processing to step S424. Based on a user operation using the GUI displayed on the display unit 107 or the display unit (not shown) of the remote terminal 300, the system control unit 101 determines whether the operation mode of the camera 100 is set in the moving image shooting mode.

The processing from step S421 to step S424 of FIG. 12 is similar to the processing from step S421 to step S424 of FIG. 4C.

In the processing from step S421 to step S424, the system control unit 101 performs the fan control during moving image recording (1304) in accordance with the current sound recording setting ("ON" or "OFF") acquired in step S1201. When the sound recording setting is set in "ON", the system control unit 101 changes the rotation speed of the fan to the rotation speed (1305) set by the user in mode 1 (step S423). When the sound recording setting is set in "OFF", the system control unit 101 changes the rotation speed of the fan to the maximum rotation speed (1306) in mode 1 (step S424).

Note that in the fourth embodiment, when a sound data transmission request is received in the external transfer mode, when the sound recording setting is set in "NO", silent sound data generated by the sound input unit 114 of the camera 100 is transmitted to the external apparatus. Therefore, when a sound data transmission request is received in the external transfer mode, even when the sound recording setting is set in "NO", the rotation speed of the fan is changed to the rotation speed (1305) set by the user in mode 1.

As has been described above, according to the fourth embodiment, it is possible to variably control the cooling capability of a cooling unit 206 in accordance with the operation state of the camera 100. With this, when the camera 100 is not recording a moving image (during standby), the fan is driven at the maximum speed to maximize the cooling capability of the fan, thereby enabling long-term moving image recording. Further, upon starting moving image recording or performing external transfer, the rotation speed of the fan is lowered to reduce fan driving sound. Hence, it is possible to reduce mixing of fan driving sound during sound recording without bothering the user. Thus, the cooling control along with user's intention can be performed.

Other Embodiment

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2023-099545, filed Jun. 16, 2023 and 2024-045344, filed Mar. 21, 2024 which are hereby incorporated by reference herein in their entirety.

What is claimed is:

1. An electronic apparatus which can record a moving image and sound, comprising:

a cooling unit that cools the electronic apparatus;

a setting unit that sets an operation mode of the cooling unit; and a control unit that controls the cooling unit based on a state of the electronic apparatus and the operation mode of the cooling unit, wherein the setting unit can set the operation mode of the cooling unit in an activation state and a non-activation state of the electronic apparatus, the operation mode of the cooling unit in the activation state of the electronic apparatus includes a plurality of driving states and a stop state, and the operation mode of the cooling unit in the non-activation state of the electronic apparatus includes a single driving state and a stop state, and wherein the control unit sets the operation mode of the cooling unit to the operation mode set by the setting unit, when sound recording is in progress, and sets the operation mode of the cooling unit to a driving state in which a cooling capability of the cooling unit is maximum, when sound recording is not in progress.

2. The apparatus according to claim 1, wherein when moving image recording is in progress and sound recording is not in progress, the control unit sets the operation mode of the cooling unit to the driving state in which the cooling capability of the cooling unit is maximum.

3. The apparatus according to claim 1, wherein when moving image recording is not in progress and sound recording is in progress, the control unit sets the operation mode of the cooling unit set by the setting unit.

4. The apparatus according to claim 1, wherein the operation mode of the cooling unit includes a driving state and a stop state.

5. The apparatus according to claim 1, wherein the electronic apparatus is an image capture apparatus that can perform shooting corresponding to a predetermined cycle, and in accordance with whether a mode of performing shooting corresponding to the predetermined cycle is set in the activation state of the electronic apparatus, the control unit changes the operation mode of the cooling unit in the activation state of the electronic apparatus, which is set by the setting unit.

6. The apparatus according to claim 1, wherein the cooling unit is provided in an accessary apparatus attachable to the electronic apparatus, upon transition to the non-activation state of the electronic apparatus, the control unit notifies the accessary apparatus of the operation mode of the cooling unit set by the setting unit and a driving time of the cooling unit, and the accessary apparatus controls the cooling unit based on the operation mode and the driving time notified by the electronic apparatus.

7. An electronic apparatus, comprising:

a cooling unit that cools the electronic apparatus;

a first setting unit that sets an operation mode of the cooling unit;

a second setting unit that sets a timer that measures a time from acceptance of the moving image shooting instruction to a start of the moving image shooting; and a control unit that controls the cooling unit based on the operation mode of the cooling unit, wherein the operation mode includes a predetermined operation mode for, in a standby state of the electronic apparatus, setting the cooling unit in a first state in which a cooling capability is maximum, and in a moving image shooting state of the electronic apparatus, setting the cooling unit in a second state different from the first state, and when a moving image shooting instruction is received, the control unit controls the cooling unit to transition to the predetermined operation mode and then start the moving image shooting, and the control unit controls the cooling unit to complete transition to the predetermined operation mode within a setting time of the timer.

8. The apparatus according to claim 7, further comprising a third setting unit that sets a first setting in which the moving image shooting is started after completion of transition of the cooling unit to the predetermined operation mode, and a second setting in which the moving image shooting is started without waiting for completion of transition of the cooling unit to the predetermined operation mode.

9. The apparatus according to claim 7, wherein the control unit performs control to start the moving image shooting when the second state in the predetermined operation mode is setting to stop an operation of the cooling unit.

10. An electronic apparatus comprising:

a cooling unit that cools the electronic apparatus;

a setting unit that sets an operation mode of the cooling unit;

a control unit that controls the cooling unit based on the operation mode of the cooling unit; and a transmission unit that transmits a moving image and/or sound from the electronic apparatus to an external apparatus, wherein the operation mode includes a predetermined operation mode for, in a standby state of the electronic apparatus, setting the cooling unit in a first state in which a cooling capability is maximum, and in a moving image shooting state of the electronic apparatus, setting the cooling unit in a second state different from the first state, and the control unit determines whether a transmission request for the moving image and/or the sound is received from the external apparatus, and in a case where the transmission is performed, the control unit controls whether to transition to the predetermined operation mode based on a determination result.

11. The apparatus according to claim 10, wherein in a case where the transmission is not performed, the control unit sets the cooling unit in the first state.

12. The apparatus according to claim 10, wherein in a case where the transmission is performed, when it is determined that a sound transmission request is received, the control unit controls the cooling unit to transition to the predetermined operation mode.

13. The apparatus according to claim 10, wherein in a case where the transmission is performed, when it is determined that a sound transmission request is not received, the control unit sets the cooling unit in the first state.

14. The apparatus according to claim 10, further comprising a sound recording setting unit that set whether to perform sound recording, wherein in a case where the transmission is performed, when it is determined that a sound transmission request is received, the control unit controls the cooling unit to transition to the predetermined operation mode even when it is set not to perform the sound recording.

15. A method for controlling an electronic apparatus including a cooling unit that cools the electronic apparatus, the method comprising:

a first setting step that sets an operation mode of the cooling unit;

a second setting step that sets a timer that measures a time from acceptance of the moving image shooting instruction to a start of the moving image shooting; and a control step that controls the cooling unit based on the operation mode of the cooling unit, wherein the operation mode includes a predetermined operation mode for, in a standby state of the electronic apparatus, setting the cooling unit in a first state in which a cooling capability is maximum, and in a moving image shooting state of the electronic apparatus, setting the cooling unit in a second state different from the first state, and when a moving image shooting instruction is received, the control step controls the cooling unit to transition to the predetermined operation mode and then start the moving image shooting, and the control step controls the cooling unit to complete transition to the predetermined operation mode within a setting time of the timer.

16. A method for controlling an electronic apparatus including a cooling unit that cools the electronic apparatus and a transmission unit that transmits a moving image and/or sound from the electronic apparatus to an external apparatus, the method comprising:

a setting step that sets an operation mode of the cooling unit;

a control step that controls the cooling unit based on the operation mode of the cooling unit, wherein the operation mode includes a predetermined operation mode for, in a standby state of the electronic apparatus, setting the cooling unit in a first state in which a cooling capability is maximum, and in a moving image shooting state of the electronic apparatus, setting the cooling unit in a second state different from the first state, and the control step determines whether a transmission request for the moving image and/or the sound is received from the external apparatus, and in a case where the transmission is performed, the control step controls whether to transition to the predetermined operation mode based on a determination result.

17. A non-transitory computer-readable storage medium storing a computer program which causes a computer to execute a method for controlling an electronic apparatus, the electronic apparatus including a cooling unit that cools the electronic apparatus, the method comprising:

a first setting step that sets an operation mode of the cooling unit;

a second setting step that sets a timer that measures a time from acceptance of the moving image shooting instruction to a start of the moving image shooting; and a control step that controls the cooling unit based on the operation mode of the cooling unit, wherein the operation mode includes a predetermined operation mode for, in a standby state of the electronic apparatus, setting the cooling unit in a first state in which a cooling capability is maximum, and in a moving image shooting state of the electronic apparatus, setting the cooling unit in a second state different from the first state, and when a moving image shooting instruction is received, the
control step controls the cooling unit to transition to the
predetermined operation mode and then start the mov-
ing image shooting, and the control step controls the cooling unit to complete
transition to the predetermined operation mode within
a setting time of the timer.

18. A non-transitory computer-readable storage medium
storing a computer program which causes a computer to
execute a method for controlling an electronic apparatus
including a cooling unit that cools the electronic apparatus
and a transmission unit that transmits a moving image and/or
sound from the electronic apparatus to an external apparatus,
the method comprising:

a setting step that sets an operation mode of the cooling
unit;

a control step that controls the cooling unit based on the
operation mode of the cooling unit, wherein the operation mode includes a predetermined operation
mode for, in a standby state of the electronic apparatus,
setting the cooling unit in a first state in which a cooling
capability is maximum, and in a moving image shoot-
ing state of the electronic apparatus, setting the cooling
unit in a second state different from the first state, and the control step determines whether a transmission
request for the moving image and/or the sound is
received from the external apparatus, and in a case where the transmission is performed, the control
step controls whether to transition to the predetermined
operation mode based on a determination result.

* * * * *